United States Patent
Xian et al.

(10) Patent No.: US 11,513,407 B2
(45) Date of Patent: Nov. 29, 2022

(54) ARRAY SUBSTRATE AND DISPLAY DEVICE

(71) Applicant: BOE TECHNOLOGY GROUP CO., LTD., Beijing (CN)

(72) Inventors: Jianbo Xian, Beijing (CN); Hongfei Cheng, Beijing (CN); Jian Xu, Beijing (CN); Yong Qiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 377 days.

(21) Appl. No.: 16/492,294

(22) PCT Filed: Jan. 21, 2019

(86) PCT No.: PCT/CN2019/072549
§ 371 (c)(1),
(2) Date: Sep. 9, 2019

(87) PCT Pub. No.: WO2019/233113
PCT Pub. Date: Dec. 12, 2019

(65) Prior Publication Data
US 2021/0325740 A1      Oct. 21, 2021

(30) Foreign Application Priority Data

Jun. 4, 2018 (CN) .......................... 201820858567.6

(51) Int. Cl.
*G02F 1/1362* (2006.01)
*G02F 1/1335* (2006.01)
(Continued)

(52) U.S. Cl.
CPC .. *G02F 1/136286* (2013.01); *G02F 1/136218* (2021.01); *G02F 1/1368* (2013.01);
(Continued)

(58) Field of Classification Search
CPC ......... G02F 1/136286; G02F 1/136218; G02F 1/134336; G02F 1/155; G02F 1/0316
See application file for complete search history.

(56) References Cited

U.S. PATENT DOCUMENTS 6,980,272 B1 * 12/2005 Matthies ............. G02F 1/13439
349/139
2003/0227580 A1   12/2003 Ono et al.
(Continued)

FOREIGN PATENT DOCUMENTS

| CN | 103941488 A | 7/2014 |
|---|---|---|
| CN | 107145014 A | 9/2017 |

(Continued)

OTHER PUBLICATIONS

First Indian Office Action from Indian Patent Application No. 201917049991 dated Dec. 2, 2020.
(Continued)

*Primary Examiner* — Dung T Nguyen
(74) *Attorney, Agent, or Firm* — Dilworth & Barrese, LLP.; Michael J. Musella, Esq.

(57) ABSTRACT

An array substrate and a display device are provided, and the array substrate includes a base substrate and includes a pixel array and an auxiliary conductive structure which are on the base substrate; the pixel array includes a plurality of pixel units arranged in an array and a plurality of pixel electrodes, and each of the plurality of pixel units includes at least one of the plurality of pixel electrodes; the auxiliary conductive structure surrounds at least one of the plurality of pixel electrodes and is insulated from the plurality of pixel electrodes; a resistivity of a material of the auxiliary conductive structure is less than or equal to a resistivity of a material of the at least one of the plurality of the pixel electrodes.

20 Claims, 12 Drawing Sheets

(51) Int. Cl.
  *G02F 1/1339* (2006.01)
  *G02F 1/1343* (2006.01)
  *G02F 1/1368* (2006.01)

(52) U.S. Cl.
  CPC .... *G02F 1/13394* (2013.01); *G02F 1/133512* (2013.01); *G02F 1/133514* (2013.01); *G02F 1/134336* (2013.01); *G02F 1/136204* (2013.01); *G02F 1/136209* (2013.01); *G02F 1/136222* (2021.01); *G02F 2201/40* (2013.01)

(56) References Cited

U.S. PATENT DOCUMENTS

| | | |
|---|---|---|
| 2006/0033852 A1 | 2/2006 | Kim |
| 2017/0184932 A1 | 6/2017 | Park et al. |
| 2017/0307921 A1 | 10/2017 | Feng |
| 2017/0322469 A1 | 11/2017 | Shin et al. |
| 2018/0129110 A1 | 5/2018 | Syn et al. |
| 2018/0149893 A1 | 5/2018 | Qi et al. |

FOREIGN PATENT DOCUMENTS

| | | |
|---|---|---|
| CN | 107346079 A | 11/2017 |
| CN | 108073006 A | 5/2018 |
| CN | 208207465 U | 12/2018 |

OTHER PUBLICATIONS

Extended European Search Report from European Patent Application No. 19762083.4 dated Feb. 9, 2022.

\* cited by examiner

A-A'

B-B'

A-A'

ARRAY SUBSTRATE AND DISPLAY DEVICE

This application claims the benefit of Chinese patent application No. 201820858567.6 filed on Jun. 4, 2018, which is hereby entirely incorporated by reference as a part of the present application.

TECHNICAL FIELD

Embodiments of the present disclosure relate to an array substrate and a display device.

BACKGROUND

In a display panel, for example, in a liquid crystal display panel of an ADS display mode, in order to better avoid the influence of signal lines such as data lines and gate lines on the operation of pixel electrodes, an insulating layer for example is added between the pixel electrodes and the signal lines such as the data lines and the gate lines; the insulating layer is usually required to have a certain thickness for the purpose of reducing the above-mentioned influence, and this increases a thickness of the display panel, and is disadvantageous for thinning the display panel and a display device.

SUMMARY

At least one embodiment of the present disclosure provides an array substrate, and the array substrate includes a base substrate, a pixel array and an auxiliary conductive structure which are on the base substrate; the pixel array includes a plurality of pixel units distributed in an array and a plurality of pixel electrodes, and each of the plurality of pixel units includes at least one of the plurality of pixel electrodes; the auxiliary conductive structure surrounds at least one of the plurality of pixel electrodes and is insulated from the plurality of pixel electrodes.

For example, in the array substrate provided by at least one embodiment of the present disclosure, a material of the auxiliary conductive structure has a resistivity less than or equal to a resistivity of a material of the at least one of the plurality of pixel electrodes.

For example, in the array substrate provided by at least one embodiment of the present disclosure, the auxiliary conductive structure and the plurality of pixel electrodes are in a same layer.

For example, the array substrate provided by at least one embodiment of the present disclosure further includes a plurality of gate lines and a plurality of data lines which are provided on the base substrate and crossing each other to define the plurality of pixel units. The auxiliary conductive structure comprises a plurality of strip portions respectively extending along an extension direction of the plurality of data lines and an extension direction of the plurality of gate lines.

For example, in the array substrate provided by at least one embodiment of the present disclosure, a planar shape of the auxiliary conductive structure includes a closed loop surrounding the at least one of the plurality of pixel electrodes.

For example, in the array substrate according to at least one embodiment of the present disclosure, the plurality of pixel units include a first pixel unit and a second pixel unit which are adjacent to each other; each of the first pixel unit and the second pixel unit includes a first pixel electrode and a second pixel electrode; the planar shape of the auxiliary conductive structure includes the closed loop surrounding the second pixel electrode in the first pixel unit and the first pixel electrode in the second pixel unit.

For example, in the array substrate according to at least one embodiment of the present disclosure, the plurality of strip portions of the auxiliary conductive structure do not overlap the plurality of gate lines and do not overlap the plurality of data lines in a direction perpendicular to the base substrate.

For example, in the array substrate provided by at least one embodiment of the present disclosure, the plurality of strip portions of the auxiliary conductive structure overlap at least a part of the plurality of gate lines and/or overlap at least a part of the plurality of data lines in a direction perpendicular to the base substrate.

For example, in the array substrate according to at least one embodiment of the present disclosure, the array substrate further includes a common electrode in a layer different from a layer where the plurality of pixel electrodes are located; at least one strip portion among the plurality of strip portions of the auxiliary conductive structure comprises a plurality of hollow regions which are spaced apart from each other and penetrate through the at least one strip portion; each of the plurality of hollow regions overlaps at least a part of at least one of the plurality of gate lines, the plurality of data lines and the common electrode in the direction perpendicular to the base substrate.

For example, in the array substrate according to at least one embodiment of the present disclosure, distances between adjacent hollow regions among the plurality of hollow regions are equal; or a width of each of the plurality of hollow regions is smaller than a width of the at least one strip portion in a direction perpendicular to an extension direction of the at least one strip portion.

For example, in the array substrate according to at least one embodiment of the present disclosure, each of the plurality of pixel units further includes a thin film transistor connected with the at least one of the plurality of pixel electrodes; the auxiliary conductive structure is not transparent and covers at least a part of the thin film transistor.

For example, in the array substrate according to at least one embodiment of the present disclosure, a gate electrode of the thin film transistor is electrically connected with one of the plurality of gate lines, and a source electrode of the thin film transistor is electrically connected with one of the plurality of data lines; the plurality of strip portions of the auxiliary conductive structure include first strip portions extending along the extension direction of the plurality of gate lines, and second strip portions extending along the extension direction of the plurality of data lines; a width of each first strip portion in a direction perpendicular to an extension direction of the first strip portion is greater than a width of each second strip portion in a direction perpendicular to an extension direction of the second strip portion.

For example, in the array substrate according to at least one embodiment of the present disclosure, distances from one of the first strip portions to two of the plurality of pixel electrodes adjacent to the one of the first strip portions are not equal; or distances from one of the second strip portions to two of the plurality of pixel electrodes adjacent to the one of the second strip portions are not equal; or distances from two adjacent ones of the first strip portions to a same one of the plurality of pixel electrodes between the two adjacent ones of the first strip portions are not equal, or distances from two adjacent ones of the second strip portions to a same one of the plurality of pixel electrodes between the two adjacent ones of the second strip portions are not equal.

For example, in the array substrate according to at least one embodiment of the present disclosure, at least one pixel unit among the plurality of pixel units includes an end position, an intermediate position, and a start position close to the thin film transistor, the end position is away from the start position in an extension direction of at least one strip portion among the plurality of strip portions of the auxiliary conductive structure, and the intermediate position is at a midpoint of a connecting line between the start position and the end position. The at least one strip portion includes a first portion extending from the start position of the at least one pixel unit to the intermediate position of the at least one pixel unit and a second portion extending from the intermediate position of the at least one pixel unit to the end position of the at least one pixel unit, the first portion has a first width in a direction perpendicular to the extension direction of the at least one strip portion, the second portion has a second width in the direction perpendicular to the extension direction of the at least one strip portion, and the first width is greater than the second width; or the at least one strip portion includes a first portion, a second portion and a third portion which extend and are sequentially arranged in a direction from the start position of the at least one pixel unit to the end position of the at least one pixel unit, and a width of the first portion in the direction perpendicular to the extension direction of the at least one strip portion, a width of the second portion in the direction perpendicular to the extension direction of the at least one strip portion and a width of the third portion in the direction perpendicular to the extension direction of the at least one strip portion are sequentially decreased.

For example, the array substrate provided by at least one embodiment of the present disclosure further includes a shield component and a color filter film array. The shield component is between adjacent ones of the plurality of pixel units; the color filter film array includes a plurality of color filter films, and each of the plurality of pixel units includes one of the plurality of color filter films; the plurality of strip portions of the auxiliary conductive structure overlap the shield component in a direction perpendicular to the base substrate; the shield component is a black matrix or is a stack of two adjacent color filter films among the plurality of color filter films.

For example, in the array substrate according to at least one embodiment of the present disclosure, a planar shape of at least one pixel electrode among the plurality of pixel electrodes comprises a groove, the auxiliary conductive structure comprises a protrusion portion, and the protrusion portion is at a side of at least one of the plurality of strip portions facing the at least one pixel electrode and is corresponding to the groove; or the planar shape of at least one pixel electrode among the plurality of pixel electrodes comprises a protrusion portion, the auxiliary conductive structure comprises a groove, and the groove is at a side of at least one of the plurality of strip portions facing the at least one pixel electrode and is corresponding to the protrusion portion.

For example, in the array substrate provided by at least one embodiment of the present disclosure, the protrusion portion and the at least one of the plurality of strip portions are integral with each other.

For example, the array substrate provided by at least one embodiment of the present disclosure further includes a protrusion protruding in a direction away from the base substrate, and the protrusion is on the auxiliary conductive structure.

For example, the array substrate provided by at least one embodiment of the present disclosure further includes a leading wire on the base substrate and further comprises data driver elements or gate driver elements which are on the base substrate, the auxiliary conductive structure is grounded or is applied with a fixed voltage through the leading wire, and the leading wire is between adjacent ones of the data driver elements or adjacent ones of the gate driver elements.

At least one embodiment of the present disclosure further provides a display device including the array substrates provided by any one of the embodiments of the present disclosure.

For example, the display device provided by at least one embodiment of the present disclosure includes an opposite substrate, a liquid crystal layer and a common electrode. The opposite substrate opposes to the array substrate; the liquid crystal layer is between the array substrate and the opposite substrate; the common electrode is on the array substrate and/or the opposite substrate, the common electrode and the plurality of pixel electrodes form an electric field to control deflection of liquid crystal molecules in the liquid crystal layer, and an electrical signal applied to the auxiliary conductive structure is same as an electrical signal applied to the common electrode.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

Figure 1A:
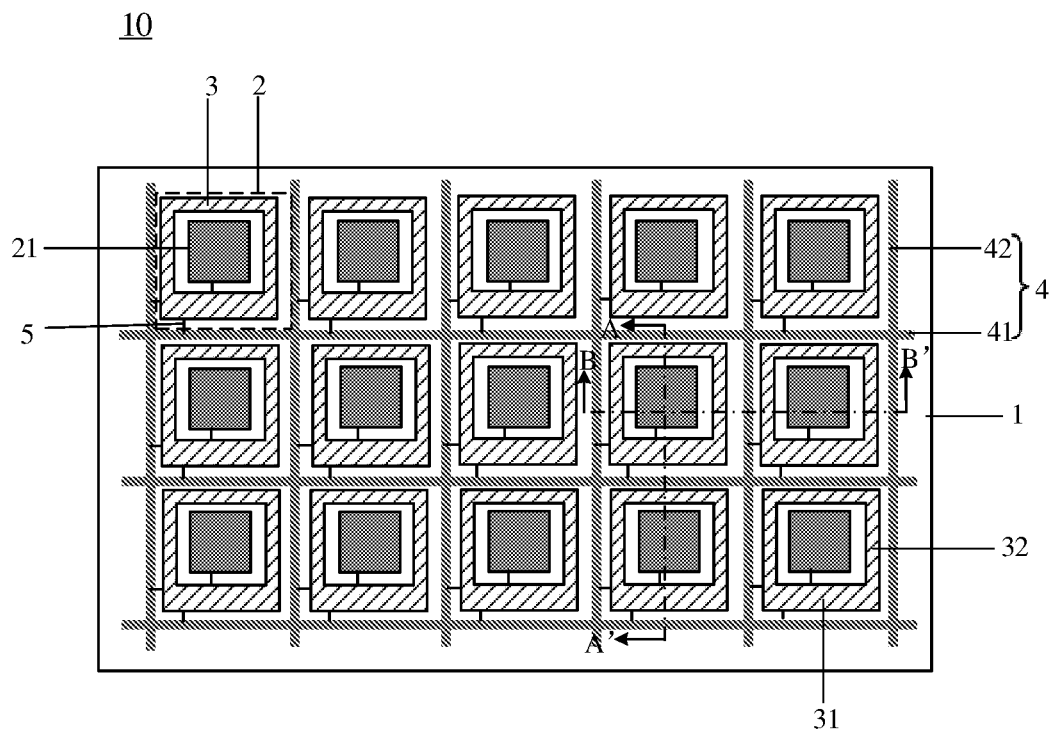
FIG. 1A is a schematic plan view of an array substrate provided by at least one embodiment of the present disclosure.

1—base substrate; 101—opposite substrate; 2—pixel unit; 201—first pixel unit; 202—second pixel unit; 21—pixel electrode; 2011/2021—first pixel electrode; 2012/2022—second pixel electrode; 3—auxiliary conductive structure; 31—first strip portion; 32—second strip portion; 4—signal line; 41—gate line; 42—data line; 60—gate driver element; 61—data driver element; 62—grounding terminal; 5—thin film transistor; 6—shield component; 7—color filter film; 8—passivation layer; 9—planarization layer; 10—array substrate; 11—hollow region; 12—protrusion; 13—common electrode; 14—display panel; 15—gate insulating layer; 16—display device; 17—leading wire; 18—liquid crystal layer.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The drawings in the present disclosure are not drawn strictly according to actual scale, the amount of pixel units is not limited to the amount shown in the drawings, and the specific size and amount of each structure may be determined according to actual needs. The drawings described in the present disclosure are merely schematic structural views.

At least one embodiment of the present disclosure provides an array substrate, and the array substrate includes a base substrate and includes a pixel array and an auxiliary conductive structure which are disposed on the base substrate. The pixel array includes a plurality of pixel units distributed in an array and a plurality of pixel electrodes, and each of the plurality of pixel units includes at least one of the plurality of pixel electrodes; the auxiliary conductive structure surrounds at least one of the plurality of pixel electrodes, and the auxiliary conductive structure is insulated from the plurality of pixel electrodes. For example, the array substrate is a display substrate and is used in a display device.

Figure 1B:
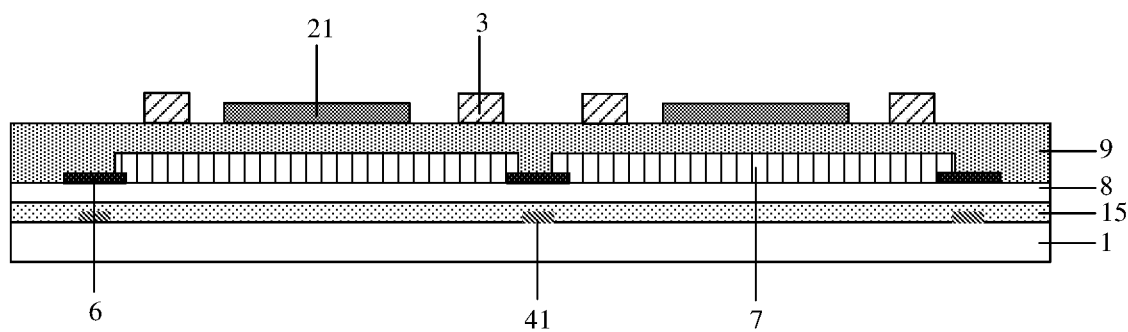
FIG. 1B is a schematic cross-sectional view taken along a line A-A' in FIG. 1A.
Figure 1C:
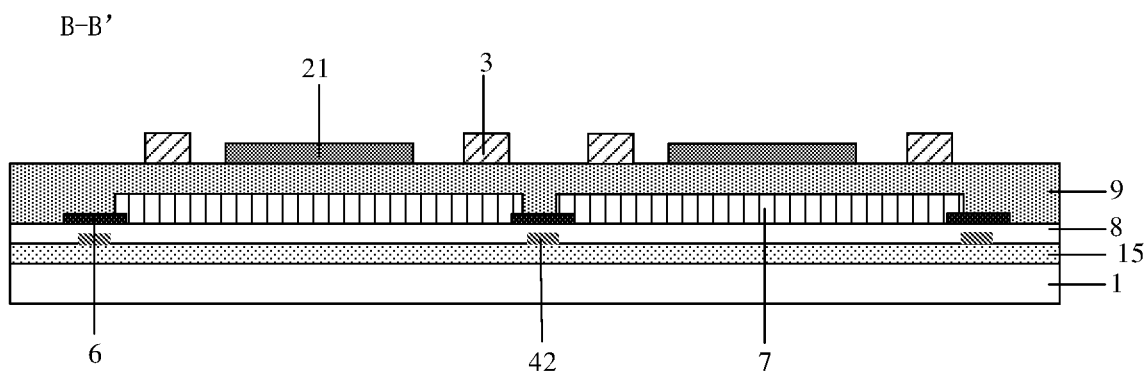
FIG. 1C is a schematic cross-sectional view taken along a line B-B' in FIG. 1A.

Illustratively, FIG. 1A is a schematic plan view of the array substrate provided by at least one embodiment of the present disclosure, FIG. 1B is a cross-sectional view taken along a line A-A' in FIG. 1A, and FIG. 1C is a cross-sectional view taken along a line B-B' in FIG. 1A. As shown in FIG. 1A, the array substrate 10 includes the base substrate 1 and includes the pixel array and the auxiliary conductive structure 3 which are disposed on the base substrate 1. The pixel array includes the plurality of pixel units 2 distributed in an array and the plurality of pixel electrodes 21, each of the plurality of pixel units 2 includes one of the plurality of pixel electrodes 21. For example, the array substrate 10 includes a plurality of auxiliary conductive structures 3. Each auxiliary conductive structure 3 surrounds one of the plurality of pixel electrodes 21 and is insulated from the plurality of pixel electrodes 21. For example, a gap is between the auxiliary conductive structure 3 and the pixel electrodes 21 to insulate the auxiliary conductive structure 3 from the pixel electrodes 21. As such, the auxiliary conductive structure 3 receives and conducts interfering charges around the pixel electrodes 21, so that the interfering charges are kept away from the pixel electrodes 21, and thereby the interference of the interfering charges on the pixel electrodes 21 is prevented or reduced; in a situation where the array substrate 10 is applied to a display device, a more accurate and stable display effect of the display device is achieved.

For example, a material of the auxiliary conductive structure 3 has a resistivity that is less than or equal to a resistivity of a material of the pixel electrode 21. In a situation where the resistivity of the auxiliary conductive structure 3 is smaller than the resistivity of the pixel electrode 21, the auxiliary conductive structure 3 is more easily to adsorb the interfering charges surrounding the pixel electrode 21 than the pixel electrode 21, and thereby is more advantageous for preventing or reducing the interference of the interfering charges on the pixel electrode 21.

For example, the material of the pixel electrode 21 is a transparent conductive material. For example, the transparent conductive material is indium tin oxide (ITO) and has the resistivity of about $5 \times 10^{-5} \sim 5 \times 10^{-4}$ ($\Omega \cdot m$); and the material of the auxiliary conductive structure is, for example, at least one selected from the group consisting of aluminum, silver, platinum, copper, grapheme, indium tin oxide (ITO) and the like and has a resistivity smaller than or equal to that of indium tin oxide (ITO). For example, the resistivity of silver is about $1.6 \times 10^{-8}$ ($\Omega \cdot m$), the resistivity of platinum is about $1.0 \times 10^{-7}$ ($\Omega \cdot m$), the resistivity of copper is about $5.0 \times 10^{-7}$ ($\Omega \cdot m$); the resistivity of iron is about $1.0 \times 10^{-7}$ ($\Omega \cdot m$), the resistivity of aluminum is about $2.9 \times 10^{-8}$ ($\Omega \cdot m$), and the resistivity of graphene is about $(8-13) \times 10^{-6}$ ($\Omega \cdot m$). In at least one embodiment, the material of the auxiliary conductive structure 3 and the material of the pixel electrode 21 are the same.

For example, as shown in FIG. 1A, the array substrate 10 further includes a plurality of signal lines 4. For example, the plurality of signal lines 4 include a plurality of gate lines 41 and a plurality of data lines 42, and the plurality of gate lines 41 and the plurality of data lines 42 are disposed on the base substrate 1 and cross each other to define the plurality of pixel units 2. For example, each auxiliary conductive structure 3 includes a plurality of strip portions extending along an extension direction of the plurality of gate lines 41 and an extension direction of the plurality of data lines 42, respectively. For example, the plurality of strip portions include first strip portions 31 and second strip portions 32. The first strip portion 31 extends in the extension direction of the gate line 41, and the second strip portion 32 extends in the extension direction of the data line 42. As such, the plurality of strip portions of the auxiliary conductive structure 3 receive and conduct the interfering charges from the gate lines 41 and the data lines 42 and around the pixel electrodes 21, cause the interfering charges to be kept away from the pixel electrodes 21, and have an electrostatically shielding effect on the pixel electrodes 21, so as to prevent or reduce the interference of these interfering charges on the pixel electrodes 21 to achieve a more accurate and stable display effect.

For example, in the embodiment shown in FIG. 1A, each auxiliary conductive structure 3 is located in the pixel unit 2 in which the pixel electrode 21 surrounded by the auxiliary conductive structure 3 is located, to make full use of the spare space of the pixel unit; and, in this case, the auxiliary conductive structure 3 is closer to the pixel electrode 21, and more effectively receives and disperses the interfering charges around the pixel electrode 21. For example, each auxiliary conductive structure 3 surrounds one of the plurality of pixel electrodes 21, that is, each pixel electrode 21 corresponds to one auxiliary conductive structure 3 to obtain a larger arrangement density of the auxiliary conductive structures 3, so as to achieve an effect that each pixel electrode 21 in the working region of the array substrate is prevented from being interfered by the interfering charges around it.

For example, a planar shape, viewed in a direction perpendicular to the base substrate 1, of the auxiliary conductive structure 3 includes a closed loop surrounding at least one of the plurality of pixel electrodes. For example, the planar shape of the auxiliary conductive structures 3 includes a plurality of closed loops respectively surrounding the plurality of pixel electrodes. Illustratively, as shown in FIG. 1A, the planar shape of the auxiliary conductive structures 3 includes the plurality of closed loops, and each closed loop surrounds one of the plurality of pixel electrodes 21. The planar shape of the auxiliary conductive structure 3 includes the closed loop, which allows the auxiliary conductive structure to simultaneously shield the interfering charges around the entire pixel electrode, for example, simultaneously shielding the static electricity from the gate lines 41 and the data lines 42 surrounding the pixel electrode. For example, in FIG. 1A, the plurality of closed loops have a same shape and a same size to facilitate patterning during the process of forming the auxiliary conductive structures. In other embodiments of the present disclosure, the shapes and sizes of the plurality of closed loops may be different from each other.

For example, as shown in FIGS. 1B and 1C, the auxiliary conductive structure 3 and the plurality of pixel electrodes 21 are in a same layer. In this way, it is not necessary to add an additional layer for providing the auxiliary conductive structure 3, which is advantageous for thinning of the array substrate 10 and simplification of the manufacturing process of the array substrate 10. For example, the auxiliary conductive structure 3 and the plurality of pixel electrodes 21 are formed simultaneously, which is advantageous for simplifying the manufacturing process of the array substrate 10. It should be noted that the auxiliary conductive structure and the plurality of pixel electrodes being in the same layer refers to that no other layer is between the auxiliary conductive structure and the plurality of pixel electrodes in a direction perpendicular to the base substrate 1. For example, the auxiliary conductive structure and the plurality of pixel electrodes contact a same layer, and the same layer is, for example, a planarization layer 9 shown in FIG. 1B.

For example, as shown in FIGS. 1A-1C, the plurality of strip portions of the auxiliary conductive structure 3 do not overlap the plurality of gate lines 41 and do not overlap the plurality of data lines 42 in the direction perpendicular to the base substrate 1, so as to prevent that a parasitic capacitance is formed, due to the auxiliary conductive structure 3 overlapping the gate line 41 and the data line 42, to interfere with the operation of the pixel electrodes 21.

For example, each of the plurality of pixel units 2 further includes a thin film transistor 5 connected with one of the plurality of pixel electrodes 21; for example, the thin film transistor 5 is connected with the pixel electrode 21 in the pixel unit 2 in which the thin film transistor 5 is located. For example, the pixel electrode 21 is electrically connected with a drain electrode of the thin film transistor 5; for example, the pixel electrode 21 is electrically connected with the drain electrode of the thin film transistor 5 through a via hole (not shown in figures), and those skilled in the art may design according to actual requirements. For example, the auxiliary conductive structure 3 is not transparent and covers at least a portion of the thin film transistor 5, to better shield a channel region of the thin film transistor 5, and thereby to prevent that a semiconductor material of the channel region of the thin film transistor 5 is exposed to light to generate a leakage current.

The array substrate 10 further includes a shield component 6 between adjacent pixel units among the plurality of pixel units 2; in the direction perpendicular to the base substrate 1, the plurality of strip portions of the auxiliary conductive structure 3 do not overlap the shield component 6. For example, in the embodiments illustrated in FIGS. 1A-1C, the shield component 6 is a black matrix located between adjacent pixel units. The array substrate 10 further includes a color filter film 7 in each pixel unit 2, the black matrix spaces the color filter films 7 in the adjacent pixel units 2 apart from each other, so as to prevent crosstalk of light in the adjacent pixel units 2.

Figure 1D:
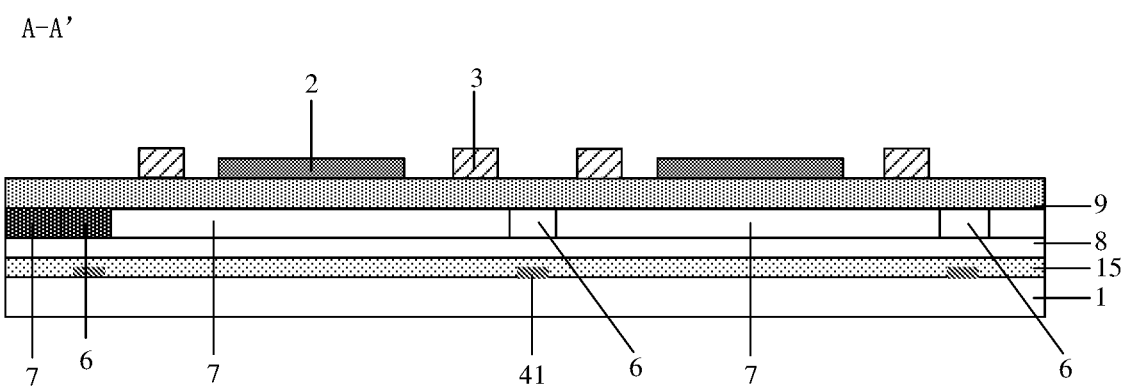
FIG. 1D is another schematic cross-sectional view taken along the line A-A' in FIG. 1A.

For example, the array substrate further includes a color filter film array including a plurality of color filter films 7, and each of the plurality of pixel units 21 includes one of the plurality of color filter films 7. For example, in the at least one embodiment shown in FIG. 1D, the shield component 6 is a stack formed by overlapping the color filter films 7 in the adjacent pixel units 2, to prevent crosstalk of light in the adjacent pixel units 2. The embodiments of the present disclosure do not limit the specific type of the shield component 6.

It should be understood that the shield component 6 may be the black matrix or may be the stack of two adjacent color filter films of the plurality of color filter films 7; or the shield component 6 may include the black matrix and the stack of two adjacent color filter films 7. For example, the auxiliary conductive structure 3 is located between two adjacent black matrixes; for example, the auxiliary conductive structure 3 is located between two stacks of the color filter films 7.

For example, the array substrate 10 further includes a gate insulating layer 15 covering the gate lines 41, a passivation layer 8 covering the thin film transistor 5 and the data lines 42, and the planarization layer 9 covering the color filter films 7 and the shield component 6. A surface which is included by the planarization layer 9 and is away from the base substrate 1 is a planar surface, and the pixel electrodes 21 and the auxiliary conductive structure 3 are disposed on the planar surface.

For example, in other embodiments of the present disclosure, not every pixel electrode corresponds to one auxiliary conductive structure. In other embodiments of the present disclosure, for example, one closed auxiliary conductive structure 3 surrounds several pixel electrodes 21, that is, the several pixel electrodes 21 share one auxiliary conductive structure 3.

Figure 2:
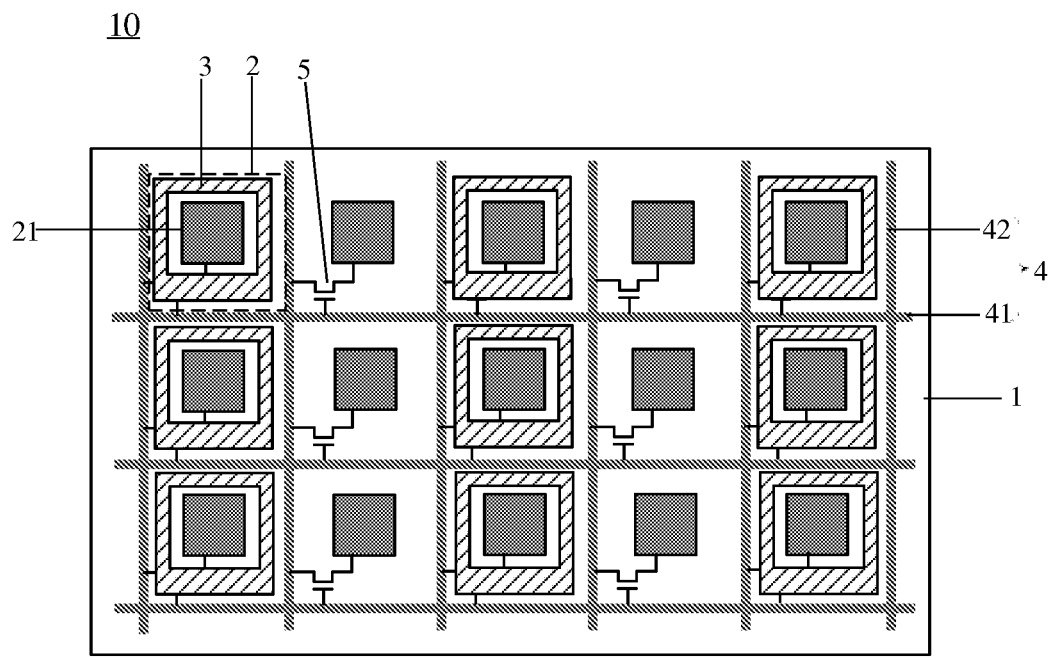
FIG. 2 is another schematic plan view of the array substrate provided by at least one embodiment of the present disclosure.

FIG. 2 is another schematic plan view of the array substrate provided by at least one embodiment of the present disclosure. As shown in FIG. 2, the array substrate 10 is different from the array substrate of FIG. 1A in that not every pixel electrode 21 corresponds to one auxiliary conductive structure 3, but a part of the pixel electrodes 21 are surrounded by the auxiliary conductive structures 3. For example, the pixel electrodes 21 in the pixel units 2 of odd-numbered columns of the pixel array are respectively surrounded by the auxiliary conductive structures 3, and the pixel electrodes 21 in the pixel units 2 of even-numbered columns of the pixel array are not surrounded by the auxiliary conductive structures 3. Other features of the array substrate 10 shown in FIG. 2 may be the same as those of the array substrate in FIG. 1A, please refer to the previous descriptions. It should be understood that the auxiliary conductive structures 3 in FIGS. 1A and 2 may be electrically insulated from each other, or a part of or all of the auxiliary conductive structures 3 may be electrically connected with each other. For example, the auxiliary conductive structures 3 corresponding to the pixel units 2 of the m-th column are connected with each other; the auxiliary conductive structures 3 corresponding to the pixel units 2 of the n-th column are connected with each other (m is not equal to n, and n is a natural number). The following embodiments are similar and will not be described again.

Figure 3:
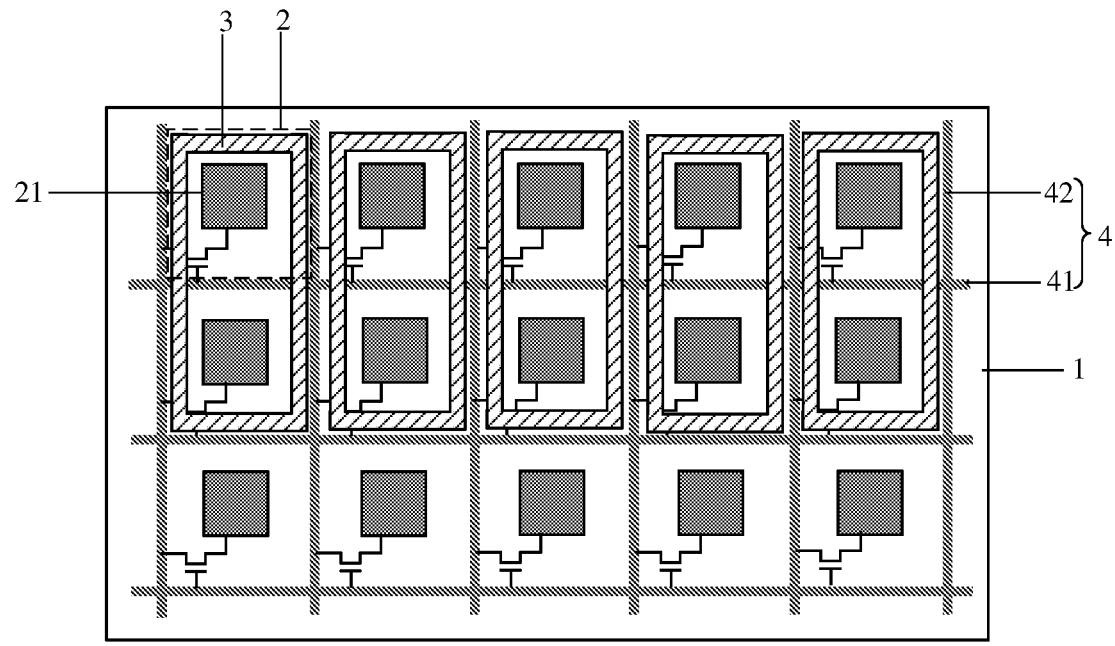
FIG. 3 is still another schematic plan view of the array substrate provided by at least one embodiment of the present disclosure.

FIG. 3 is still another schematic plan view of the array substrate provided by at least one embodiment of the present disclosure. As shown in FIG. 3, the array substrate 10 is different from the array substrate in FIG. 1A in that the planar shape, vied in the direction perpendicular to the base substrate 1, of the auxiliary conductive structure 3 includes the closed loop surrounding two or more of the plurality of pixel electrodes. For example, the auxiliary conductive structures 3 includes a plurality of closed loops, and each closed loop surrounds the pixel electrodes 21 in two adjacent pixel units 2. In other embodiments of the present disclosure, the amount of the pixel electrodes 21 surrounded by each auxiliary conductive structure 3 is not limited to two. Other features of the array substrate 10 shown in FIG. 3 are the same as those of the array substrate in FIG. 1A, please refer to the previous description.

Figure 4A:
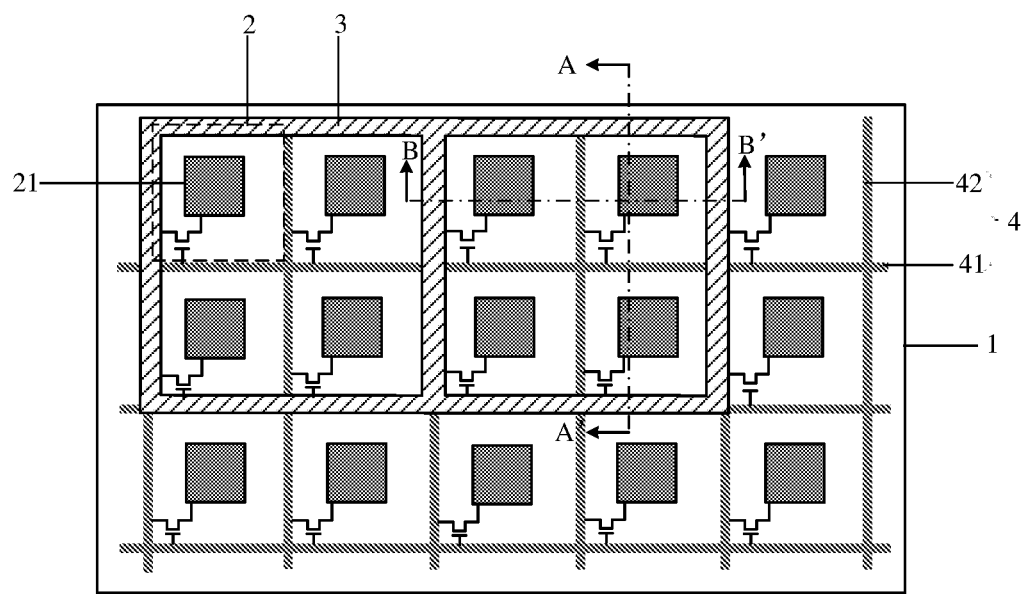
FIG. 4A is still another schematic plan view of the array substrate provided by at least one embodiment of the present disclosure.
Figure 4B:
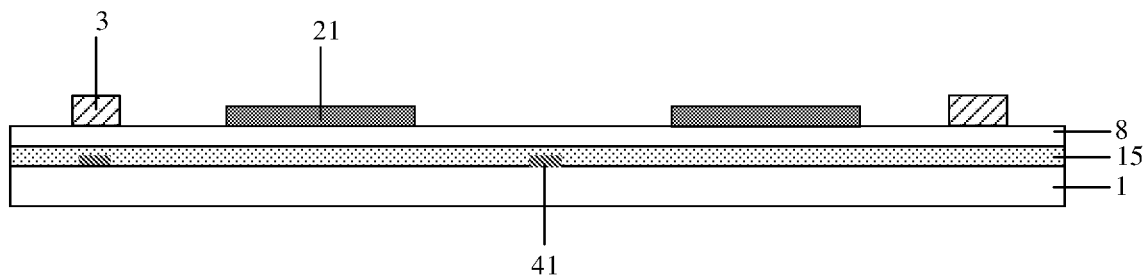
FIG. 4B is a schematic cross-sectional view taken along a line A-A' in FIG. 4A.
Figure 4C:
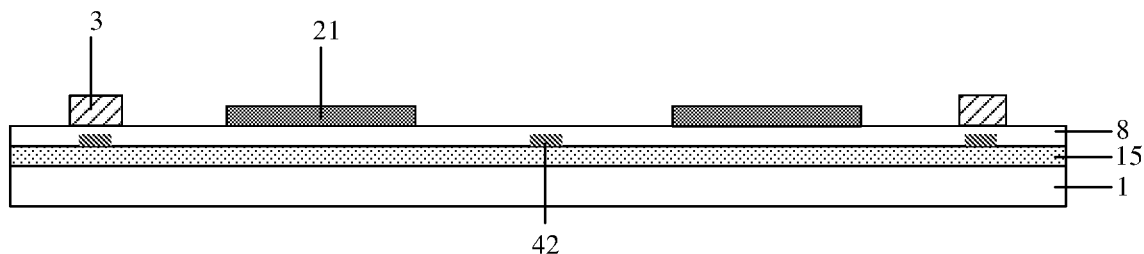
FIG. 4C is a schematic cross-sectional view taken along a line B-B' in FIG. 4A.

For example, FIG. 4A is still another schematic plan view of the array substrate provided by at least one embodiment of the present disclosure, FIG. 4B is a cross-sectional view taken along a line A-A' in FIG. 4A, and FIG. 4C is a cross-sectional view taken along a line B-B' in FIG. 4A. In FIGS. 4A-4C, the array substrate 10 is different from the array substrate of FIG. 1A in that the auxiliary conductive structure 3 includes a plurality of closed loops, each closed loop surrounds the pixel electrodes 21 in four adjacent pixel units 2; in the direction perpendicular to the base substrate 1, the plurality of strip portions of the auxiliary conductive structure 3 respectively overlap a part of the plurality of gate lines 41 and a part of the plurality of data lines 42 to facilitate better reception and conduction of the interfering charges from the gate lines and the data lines, thereby better preventing or reducing the interference of these interfering charges on the pixel electrodes. In the embodiments of the present disclosure, for example, the plurality of strip portions of the auxiliary conductive structure 3 respectively overlap a part or all of the plurality of gate lines 41 and the plurality of data lines 42. Other features of the array substrate 10 shown in FIG. 4A are the same as those of the array substrate in FIG. 1A, please refer to the previous description.

Figure 5A:
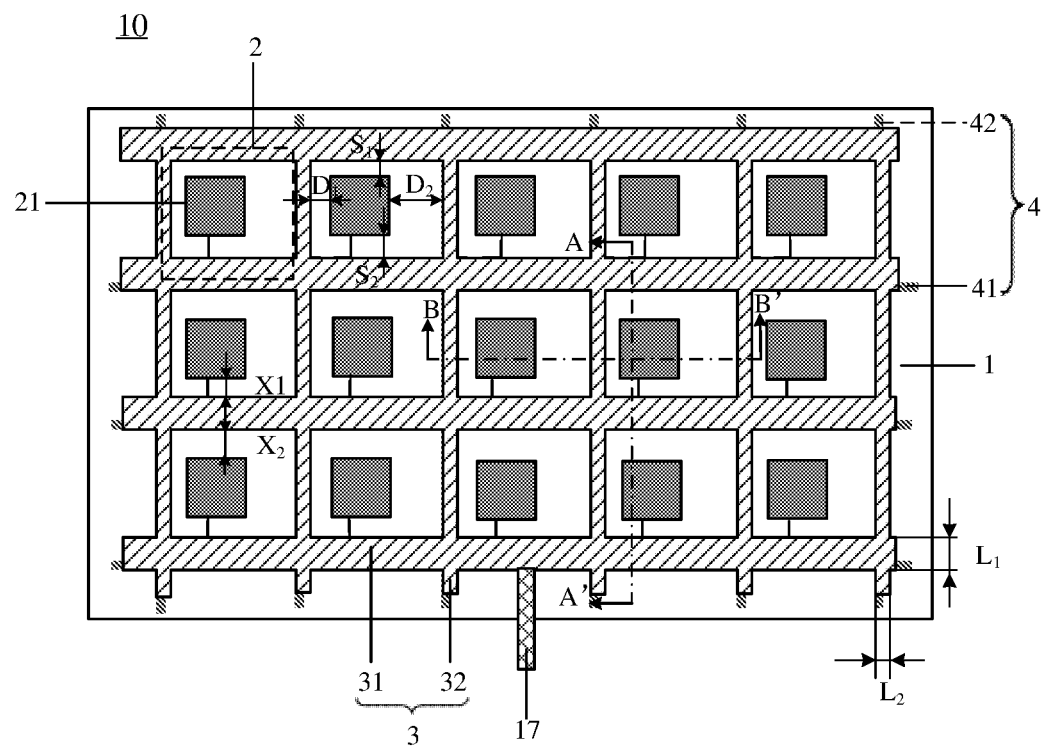
FIG. 5A is still another schematic plan view of the array substrate provided by at least one embodiment of the present disclosure.
Figure 5B:
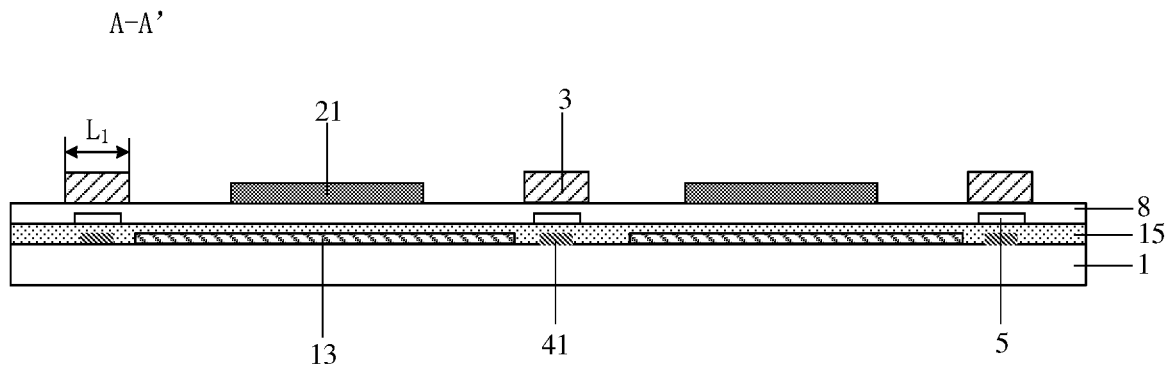
FIG. 5B is a schematic cross-sectional view taken along a line A-A' in FIG. 5A.
Figure 5C:
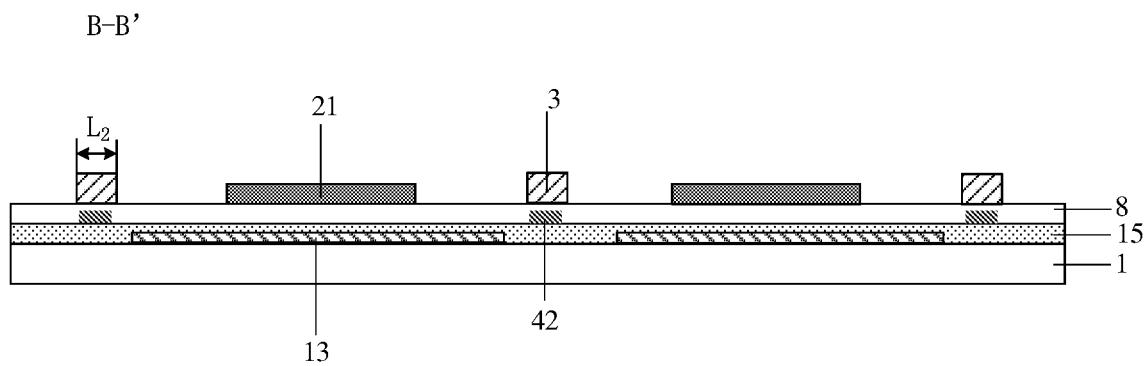
FIG. 5C is a schematic cross-sectional view taken along a line B-B' in FIG. 5A.

FIG. 5A is still another schematic plan view of the array substrate provided by at least one embodiment of the present disclosure, FIG. 5B is a cross-sectional view taken along a line A-A' in FIG. 5A, and FIG. 5C is a cross-sectional view taken along a line B-B' in FIG. 5A. In FIGS. 5A-5C, the array substrate 10 is different from the array substrate of FIG. 1A in that the auxiliary conductive structure 3 includes the plurality of strip portions, the plurality of strip portions are respectively along the extension direction of the plurality of gate lines 41 and the extension direction of the plurality of data lines 42, and the plurality of strip portions of the auxiliary conductive structure 3 are located in the non-display region between the adjacent pixel units 2, which facilitates better receiving and conducting of the interfering charges from the gate lines and data lines while reducing the influence on the aperture ratio, so as to better prevent or reduce the interference of these interfering charges on the pixel electrodes.

For example, in FIGS. 5A and 5B, in the direction perpendicular to the base substrate 1, the plurality of strip portions of the auxiliary conductive structure 3 respectively overlap the plurality of gate lines 41 and the plurality of data lines 42, so that it is advantageous to better receive and conduct the interfering charges from the gate lines and the data lines, thereby better preventing or reducing the interference of these interfering charges on the pixel electrodes. For example, the gate line 41 and the data line 42 are respectively electrically connected with the thin film transistor 5; the plurality of strip portions of the auxiliary conductive structure 3 include the first strip portions 31 and the second strip portions 32, the first strip portions 31 extend along the extension direction of the plurality of gate lines 41, and the second strip portions 32 extend along the extension direction of the plurality of data lines 42. For example, in the at least one embodiment illustrated in FIG. 5A, the first strip portion 31 partially overlaps the gate line 41; the second strip portion 32 partially overlaps the data line 42. A width L1 of the first strip portion 31 in a direction perpendicular to the extension direction of the first strip portion 31 is larger than a width L2 of the second strip portion 32 in a direction perpendicular to the extension direction of the second strip portion 32. A portion of the gate line 42 corresponds to the channel region of the thin film transistor, thus it is advantageous for the first strip portion 31 to more fully shield the channel region of the thin film transistor 5, thereby preventing or reducing the leakage current generated due to exposure of the semiconductor material of the channel region in the thin film transistor 5 to light.

For example, in at least one embodiment of the present disclosure, distances from the first strip portion to two pixel electrodes adjacent to the first strip portion among the plurality of pixel electrodes are not equal. Similarly, distances from the second strip portion to two pixel electrodes adjacent to the second strip portion among the plurality of pixel electrodes are not equal. Illustratively, as shown in FIG. 5A, the distances from the first strip portion 31 to the two pixel electrodes adjacent to the first strip portion 31 among the plurality of pixel electrodes 21 are X1 and X2, respectively, and X1 and X2 are not equal.

For example, distances from two adjacent first strip portions to the same pixel electrode located between the two adjacent first strip portions are not equal, or distances from two adjacent second strip portions to the same pixel electrode located between the two adjacent second strip portions are not equal. At least one of the first strip portions and the second strip portions have an unequal distance to the same pixel electrode. For example, the distances from the two adjacent first strip portions 31 to the same pixel electrode located between the two adjacent first strip portions 31 are $S_1$ and $S_2$, respectively, and $S_1$ and $S_2$ are not equal. For example, the distances from the two adjacent second strip portions 32 to the same pixel electrode located between the two adjacent second strip portions 32 are $D_1$ and $D_2$, respectively, and $D_1$ and $D_2$ are not equal. For example, $D_1$, $D_2$, $S_1$ and $S_2$ are unequal. For example, $D_2 > D_1 > S_2 > S_1$. For example, $D_2$ is greater than $D_1$ and $S_2$ is greater than $S_1$. The embodiments of the present disclosure do not limit the relationships between $D_1$, $D_2$, $S_1$ and $S_2$.

For example, as shown in FIGS. 5A and 5B, the array substrate 10 further includes a leading wire 17, and the auxiliary conductive structure 3 is grounded or is applied with a fixed voltage through the leading wire 17, so that a voltage applied to the auxiliary conductive structure 3 is zero or the fixed voltage. For example, the array substrate 10 further includes a driver element configured for controlling the operation of the pixel units. For example, the driver element is a drive circuit. The auxiliary conductive structure 3 is connected with a grounded terminal of the drive circuit through the leading wire 17, so that the voltage applied to the auxiliary conductive structure 3 is zero; or, in the array substrate 10, the auxiliary conductive structure 3 receives the fixed voltage from the drive circuit through the leading wire 17, and for example, the fixed voltage is a common voltage (which is a voltage applied to a common electrode in a situation where the array substrate further includes the common electrode), in which case, the voltage applied to the auxiliary conductive structure 3 is the same as the voltage applied to the common electrode 13. For example, in the at least one embodiment shown in FIG. 5A, the auxiliary conductive structure 3 is separated from the common electrode, and the auxiliary conductive structure 3 and the common electrode 13 are respectively applied with the common voltage. In another embodiment, the auxiliary conductive structure 3 and the common electrode are disposed in the same layer, and for example, the common electrode and the auxiliary conductive structure 3 are integral with each other.

It should be noted that, in FIG. 1A, the array substrate 10 for example further includes the leading wire. For example, the array substrate 10 includes a plurality of leading wires, each of the plurality of leading wires respectively corresponds to one of the auxiliary conductive structures 3, and the auxiliary conductive structure 3 is grounded or is applied with the fixed voltage through the corresponding leading wire.

Figure 5D:
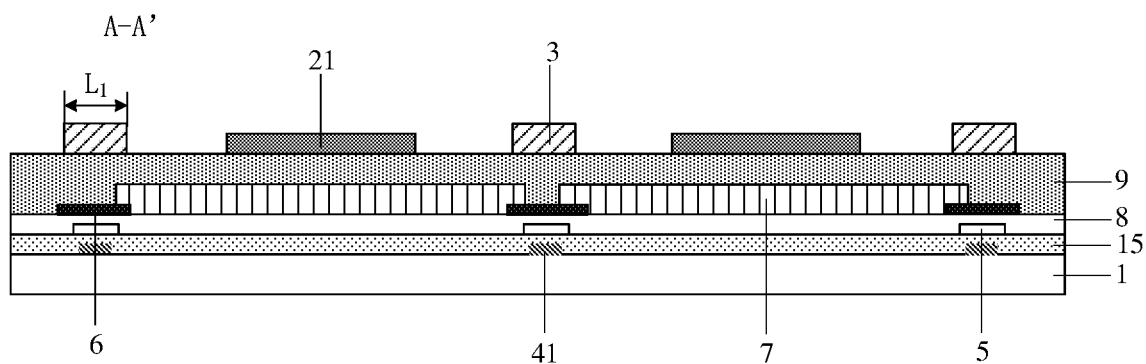
FIG. 5D is another schematic cross-sectional view taken along the line A-A' in FIG. 5A.
Figure 5E:
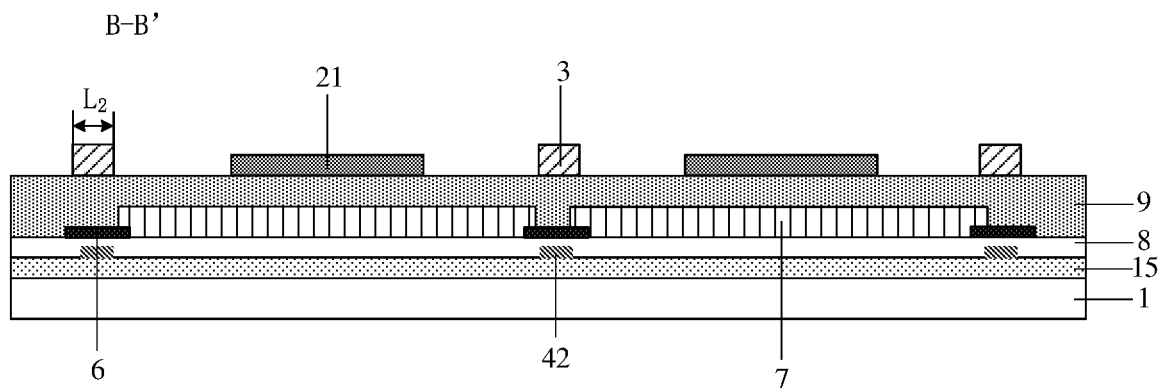
FIG. 5E is another schematic cross-sectional view taken along the line B-B' in FIG. 5A.

FIG. 5D is another schematic cross-sectional view taken along the line A-A' in FIG. 5A, and FIG. 5E is another cross-sectional view taken along the line B-B' in FIG. 5A. The at least one embodiment shown in FIGS. 5D and 5E differs from the at least one embodiment shown FIGS. 5B and 5C in that the array substrate 10 further includes the shield component 6 and the color filter film 7. The auxiliary conductive structure 3 overlaps the shield component 6 and a width of the auxiliary conductive structure 3 is smaller than a width of the shield component 6, to allow the auxiliary conductive structure 3 to be located in a non-display region, so that in the situation where the array substrate 10 is applied to the display device, the aperture ratio of the display device is not affected even the auxiliary conductive structure adopts an opaque conductive material. The shield component 6 and the color filter film 7 are the same as that in the previous embodiments, please refer to the previous description.

Figure 5F:
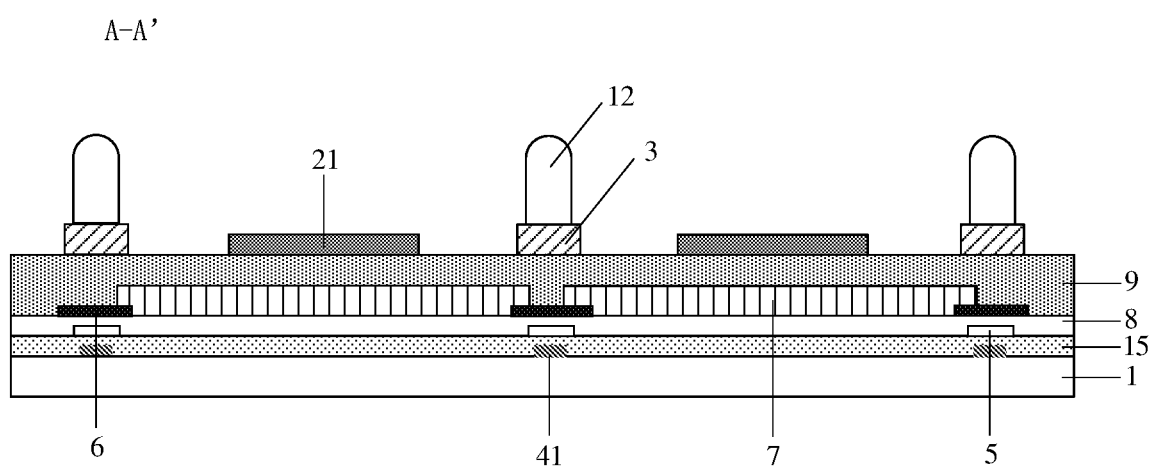
FIG. 5F is still another schematic cross-sectional view taken along the line A-A' in FIG. 5A.

FIG. 5F is another schematic cross-sectional view taken along the line A-A' in FIG. 5A. The at least one embodiment shown in FIG. 5F differs from the at least one embodiment shown in FIGS. 5D and 5E in that the array substrate 10 further includes protrusions 12, and the protrusions 12 are disposed on the auxiliary conductive structure 3 and protrude toward a direction away from the base substrate 1. For example, the array substrate 10 is applied to the display device, the protrusions 12 are spacers; for example, the spacers are strip spacers or column spacers. Thus, it is not necessary to separately provide a support layer for the protrusions 12, and thus the structures of the array substrate and the structure of the display device are simplified. For example, in the direction perpendicular to the base substrate 1, the protrusion 12 overlaps the thin film transistor 5 and the protrusion 12 is located in the non-display region, which is advantageous for better shielding the channel region of the thin film transistor 5 and improving the aperture ratio of the display device.

Figure 6A:
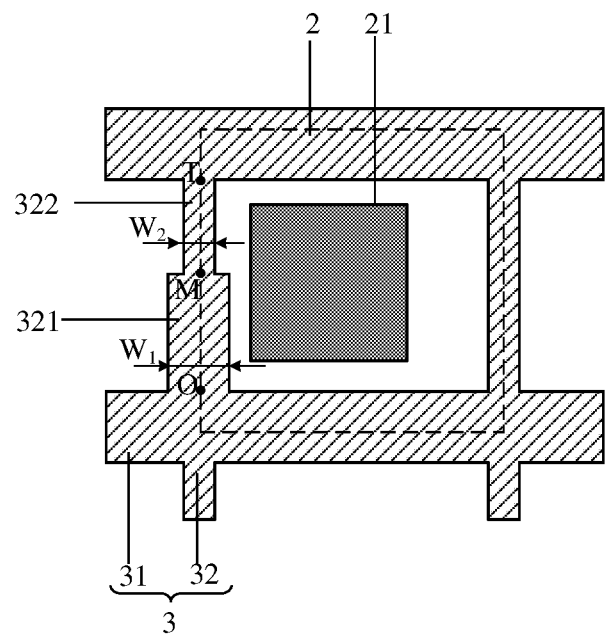
FIG. 6A is a schematic plan view showing a pixel unit of the array substrate provided by at least one embodiment of the present disclosure.
Figure 6B:
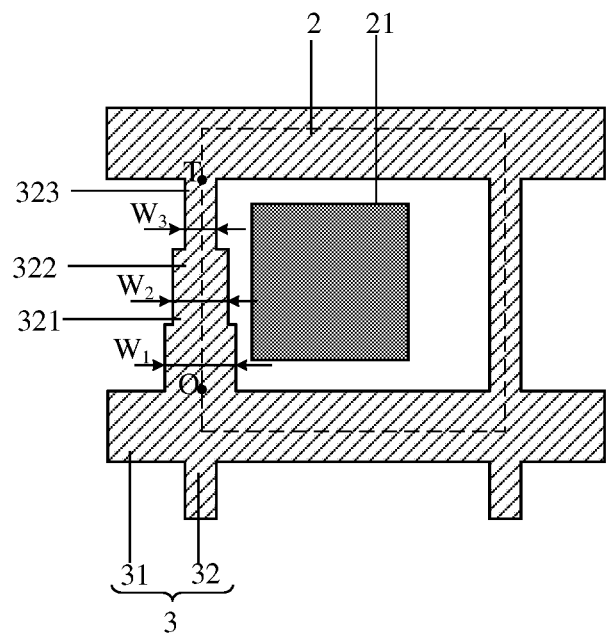
FIG. 6B is another schematic plan view of the pixel unit of the array substrate provided by an embodiment of the present disclosure.

FIG. 6A is a schematic plan view of the pixel unit of the array substrate provided by at least one embodiment of the present invention, and FIG. 6B is another schematic plan view of the pixel unit of the array substrate provided by at least one embodiment of the present disclosure. For example, in the array substrate provided by at least one embodiment of the present disclosure, each pixel unit is as shown in FIG. 6A, or each of a part of the pixel units is as shown in FIG. 6A. As shown in FIG. 6A, each of the plurality of pixel units 2 includes a start position O close to the thin film transistor 5 and includes at least one strip portion among the plurality of strip portions of the auxiliary conductive structure 3; taking the case that the at least one strip portion is the second strip portion 32 as an example, each of the plurality of pixel units 2 includes an end position T away from the start position O in the extension direction of the second strip portion 32 and includes an intermediate position M at a midpoint of a connecting line between the start position O and the end position T. The second strip portion 32 includes a first portion 321 extending from the start position O of the pixel unit 2 to the intermediate position M of the pixel unit 2 and includes a second portion 322 extending from the intermediate position M of the pixel unit 2 to the end position T of the pixel unit 2; the first portion 321 has a first width $W_1$ in a direction perpendicular to the extension direction of the second strip portion 32, the second portion 322 has a second width $W_2$ in the direction perpendicular to the extension direction of the second strip portion 32, and the width $W_1$ is greater than the second width $W_2$. On one hand, the first width $W_1$ is greater than the second width $W_2$, so as to facilitate the first portion 321 to effectively shield the thin film transistor 5, and thus to prevent that the semiconductor material of the channel region of the thin film transistor 5 is exposed to light to generate leakage current; on the other hand, the above protrusion for example is provided at the position of the start position O, and the first width $W_1$ of the first portion 321 of the strip portion at the position of the start position O is relatively large, which facilitates the stability of the structure of the protrusion and avoids manufacturing process errors. For example, as shown in FIG. 6B, taking the case that the at least one strip portion is the second strip portion 32 as an example, the second strip portion 32 includes a first portion 321, a second portion 322 and a third portion 323 which extend and are sequentially arranged in a direction from the start position O of the pixel unit 2 to the end position T of the pixel unit; a width $W_1$ of the first portion 321 in the direction perpendicular to the extension direction of the second strip portion 32, a width $W_2$ of the second portion 322 in the direction perpendicular to the extension direction of the second strip portion 32, and a width $W_3$ of the third portion in the direction perpendicular to the extension direction of the second strip portion 32 are sequentially decreased, that is, $W_1 > W_2 > W_3$. In other embodiments of the present disclosure, it is not limited to the case that the second strip portion 32 includes the first portion, the second portion and the third portion, for example it is possible that the first strip portion 31 includes the first portion, the second portion and the third portion. Also, for example, at least one of the plurality of strip portions includes a plurality of portions which extend and are sequentially arranged in the direction from the start position O of the pixel unit 2 to the end position T of the pixel unit, and the plurality of portions are not limited to three portions; widths of the plurality of portions arranged in the direction from the start position O of the pixel unit 2 to the end position T of the pixel unit are sequentially decreased; it is not limited that the first portion starts from the start position O, but it is possible that the first portion starts from any point in the direction from the start position O of the pixel unit 2 to the end position T of the pixel unit. The embodiments are also applicable to the case where one pixel unit includes two or more pixel electrodes.

Figure 6C:
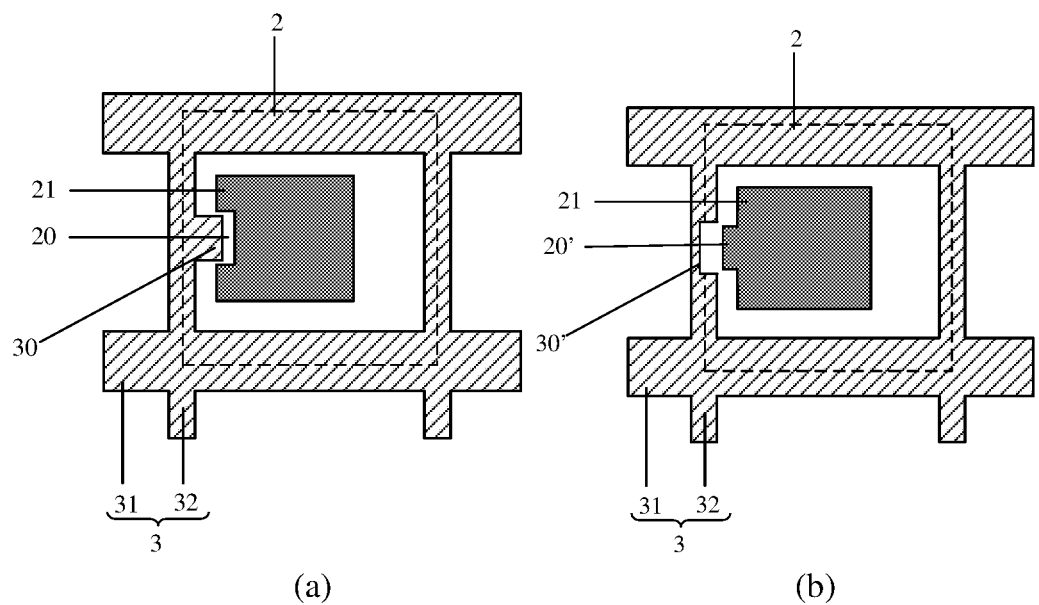
FIG. 6C is still another schematic plan view of the pixel unit of the array substrate provided by at least one embodiment of the present disclosure.

FIG. 6C is still another schematic plan view of the pixel unit of the array substrate provided by at least one embodiment of the present disclosure. As shown in part (a) of FIG. 6C, the planar shape, viewed in the direction perpendicular to the base substrate 1, of the pixel electrode 21 has a groove 20, the auxiliary conductive structure 3 includes a protrusion portion 30, and the protrusion portion 30 is located on a side of the strip portion (for example, the second strip portion 32) facing the pixel electrode 21 and is corresponding to the groove 20. The protrusion portion 30 being corresponding to the groove 20 means that, a shape of the protrusion portion 30 is substantially complementary to a shape of the groove 20, such that an outline shape of the side of the strip portion of the auxiliary conductive structure 3 facing the pixel electrode 21 is arranged according to an outline of the pixel electrode 21, so as to better prevent the interfering charges around the pixel electrode 21. In another embodiment, As shown in part (b) of FIG. 6C, for example, the auxiliary conductive structure 3 includes the groove 30' on the side of the strip portion facing the pixel electrode 21, the planar shape of the pixel electrode 21 has the protrusion portion 20' corresponding to the groove 30', and the protrusion portion 20' is complementary to the groove 30'. For example, in the array substrate provided by at least one embodiment of the present disclosure, each of the pixel units has the groove as shown in FIG. 6C, or each of a part of the pixel units has the groove as shown in FIG. 6C.

For example, as shown in FIG. 6C, the protrusion portion 30 and the at least one (for example, the second strip portion 32) of the plurality of strip portions are integral with each other. That is, in the present embodiment, the protrusion portion 30 and the second strip portion 32 are formed of a same material through a same process to simplify the structure of the array substrate and simplify the manufacturing process.

Figure 6D:
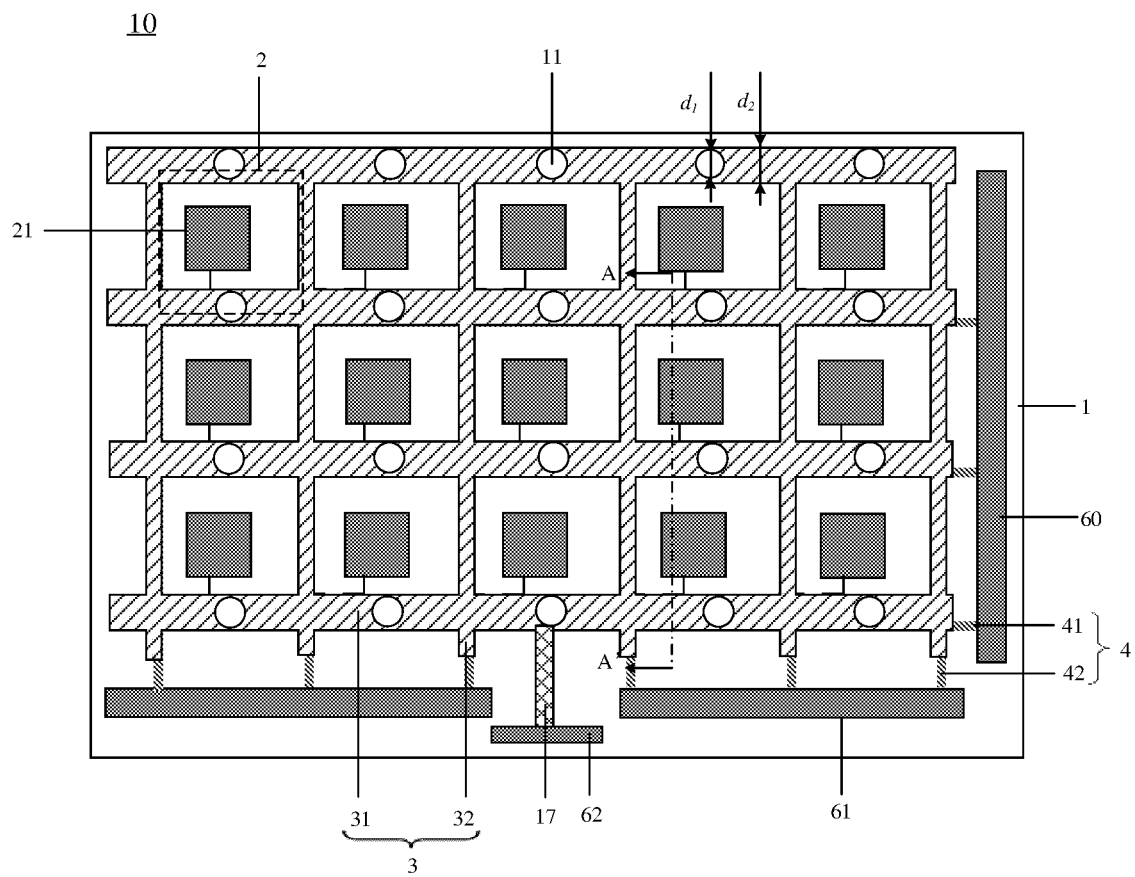
FIG. 6D is still another schematic plan view of the array substrate provided by at least one embodiment of the present disclosure.
Figure 6E:
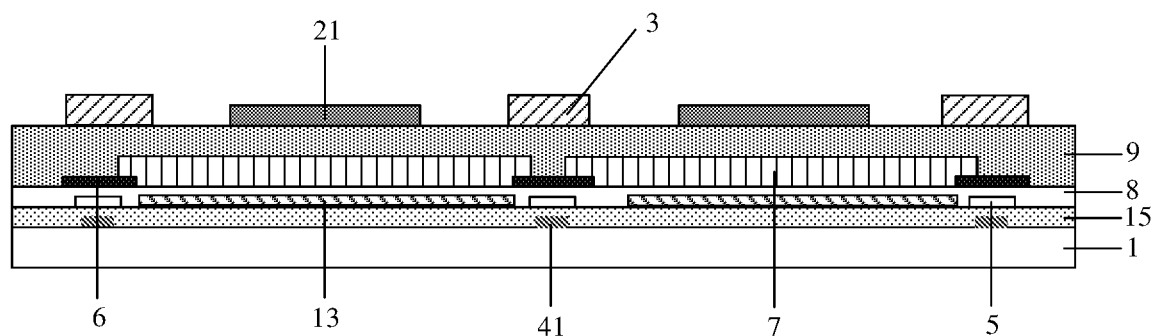
FIG. 6E is a schematic cross-sectional view taken along a line A-A' in FIG. 6D.

FIG. 6D is still another schematic plan view of the array substrate provided by at least one embodiment of the present disclosure, and FIG. 6E is a schematic cross-sectional view taken along a line A-A' in FIG. 6D. As shown in FIGS. 6D and 6E, the array substrate 10 has the following differences from the array substrate shown in FIG. 5A. At least one of the plurality of strip portions of the auxiliary conductive structure 3 includes a plurality of hollow regions 11 which are spaced apart from each other and penetrate through the at least one strip portion. As shown in FIG. 6E, for example, the array substrate 10 further includes the common electrode 13 disposed in a layer different from a layer where the plurality of pixel electrodes 21 are located, and the hollow regions 11 overlap at least a part of at least one of the gate lines 41, the data lines 42 and the common electrodes 13 in the direction perpendicular to the base substrate 1. It should be noted that the common electrode disposed in the layer different from the layer where the plurality of pixel electrodes 21 are located means that another layer exists between the common electrode and the plurality of pixel electrodes in the direction perpendicular to the base substrate.

For example, as shown in FIG. 6D, a width $d_1$ of each of the plurality of hollow regions 11 is smaller than the width $d_2$ of the at least one strip portion in the direction perpendicular to the extension direction of the at least one strip portion. For example, each first strip portion 31 includes the plurality of the above-described hollow regions 11; thus, the area of the portion which is included by the auxiliary conductive structure 3 and overlaps the gate lines 41 is reduced, thereby reducing the parasitic capacitance generated due to the overlapping of the auxiliary conductive structure 3 and the gate lines 41. Moreover, $d_1 < d_2$ maintains the electrical conduction of the auxiliary conductive structure 3 around the pixel electrodes, so that the auxiliary conductive structure 3 is grounded or is applied with the fixed voltage via one leading wire 17, which is advantageous for simplifying the structure of the array substrate. Similarly, in other embodiments of the present disclosure, the auxiliary conductive structure for example is provided with the hollow regions in a region overlapping other structures except for the gate lines and the data lines. For example, in the case where the auxiliary conductive structure 3 overlaps the common electrode line, the auxiliary conductive structure 3 is provided with the hollow regions in an overlapping region where the auxiliary conductive structure 3 overlaps the common electrode line.

For example, planar shapes, viewed in the direction perpendicular to the base substrate 1, of the plurality of hollow regions 11 are the same, and distances between adjacent hollow regions 11 among the plurality of hollow regions 11 are equal. Thus, for the interference of the interfering charges on the pixel electrodes 21 and the parasitic capacitance caused by the overlapping of the auxiliary conductive structure 3 and the gate lines 41, a relatively uniform improvement effect is obtained in the entire working region of the array substrate 10, and for example, a uniform display effect is obtained in an entire display region in the situation where the array substrate is applied to the display device.

For example, as shown in FIG. 6D, the array substrate 10 further includes the driver element and the leading wire 17. The driver element includes gate driver elements 60 and data driver elements 61. The gate driver elements 60 are connected with the gate lines 41 to control the turning on and turning off of the pixel units 2 in operation. The driver element is a drive circuit. The data driver elements 61 are connected with the data lines 42 to supply the pixel units 2 with data signals. For example, the gate driver elements 60 are gate drive circuits, and the data driver elements 61 are data drive circuits. For example, the drive circuit further includes a grounding terminal 62, and the auxiliary conductive structure 3 is connected with the grounding terminal 62 of the drive circuit through the leading wire 17, so that the voltage applied to the auxiliary conductive structure 3 is zero; or, in the array substrate 10, the auxiliary conductive structure 3 is applied with the fixed voltage in the drive circuit through the leading wire 17, and for example, the fixed voltage is the common voltage (the voltage applied to the common electrode in the situation where the array substrate further includes the common electrode), in which case the voltage applied to the auxiliary conductive structure 3 is same as the voltage applied to the common electrode 13. For example, at least one leading wire 17 is located between adjacent data driver elements 61 or adjacent gate driver elements 60.

Figure 6F:
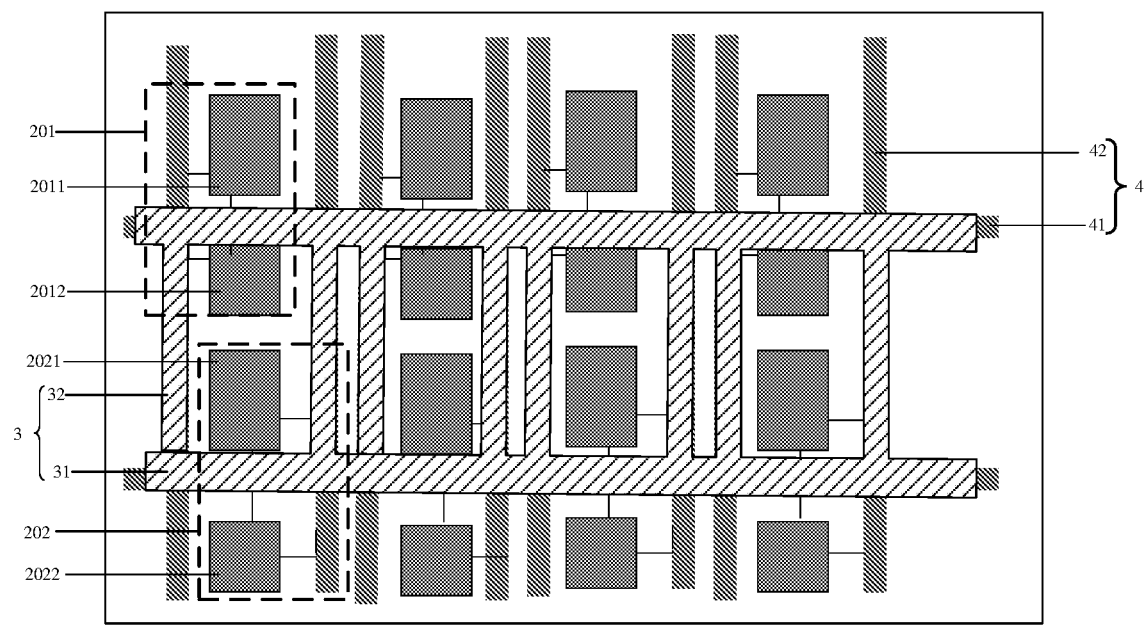
FIG. 6F is still another schematic plan view of the array substrate provided by at least one embodiment of the present disclosure.
Figure 6G:
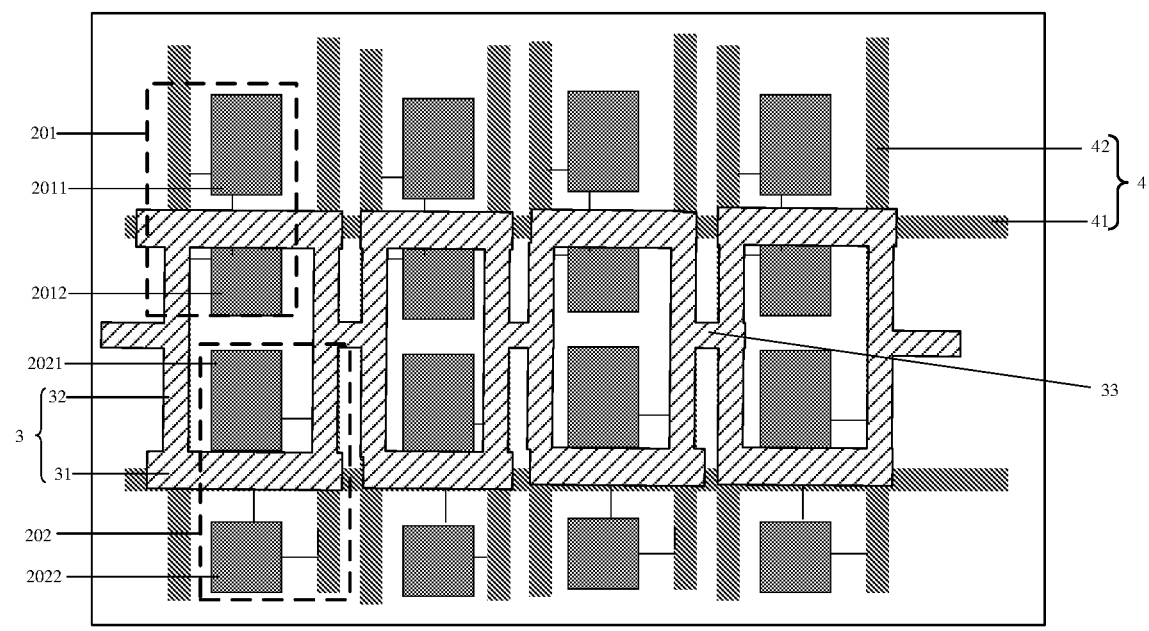
FIG. 6G is still another schematic plan view of the array substrate provided by at least one embodiment of the present disclosure.

FIG. 6F is still another schematic plan view of the array substrate provided by at least one embodiment of the present disclosure, and FIG. 6G is still another schematic plan view of the array substrate provided by at least one embodiment of the present disclosure. For example, as shown in FIGS. 6F and 6G, the plurality of pixel units include a first pixel unit 201 and a second pixel unit 202, and the first pixel unit 201 is adjacent to the second pixel unit 202; the first pixel unit 201 includes a first pixel electrode 2011 and a second pixel electrode 2012; the second pixel unit 202 includes a first pixel electrode 2021 and a second pixel electrode 2022. The planar shape of the auxiliary conductive structure 3 includes the closed loop surrounding the second pixel electrode 2012 located in the first pixel unit 201 and the first pixel electrode 2021 located in the second pixel unit 202. As such, in the case where one pixel unit includes two pixel electrodes, it is also possible to allow that the interfering charges around the pixel electrodes are kept away from the pixel electrodes by the auxiliary conductive structure, thereby preventing or reducing the interference of the interfering charges on the pixel electrodes.

For example, in the array substrate shown in FIGS. 6F and 6G, the thin film transistors (not shown in the figures) in the first pixel unit 201 are respectively connected with the first pixel electrode 2011 and the second pixel electrode 2012 in the first pixel unit 201, and the thin film transistors (not shown in the figures) in the second pixel unit 202 are respectively electrically connected with the first pixel electrode 2021 and the second pixel electrode 2022 in the second pixel unit 202. In at least one embodiment of the present disclosure, the gate electrodes of the two thin film transistors respectively connected to the two pixel electrodes in the same pixel unit are connected with the same gate line. Taking the first pixel unit 201 as an example, for example, each first pixel unit 201 includes two thin film transistors, which are a first thin film transistor and a second thin film transistor. The drain electrode of the first thin film transistor is electrically connected with the first pixel electrode 2011, and the drain electrode of the second thin film transistor is electrically connected with the second pixel electrode 2012. The gate electrode of the first thin film transistor and the gate electrode of the second thin film transistor are connected with the same gate line 41 among the plurality of gate lines. The source electrode of the first thin film transistor and the source electrode of the second thin film transistor are both electrically connected with the same data line 42 among the plurality of data lines.

For example, as shown in FIG. 6F, the plurality of closed loops are connected with each other by the first strip portions 31. Alternatively, as shown in FIG. 6G, the auxiliary conductive structure 3 further includes a connecting portion 33, and the plurality of closed loops are connected with each other through the connecting portion 33. Features that are not described again with respect to the array substrate in FIGS. 6F and 6G are the same as those in the previous embodiments, and the previous description can be referred to.

At least one embodiment of the present disclosure further provides a display panel, which includes the array substrates provided by any one of the embodiments of the present disclosure.

Figure 7:
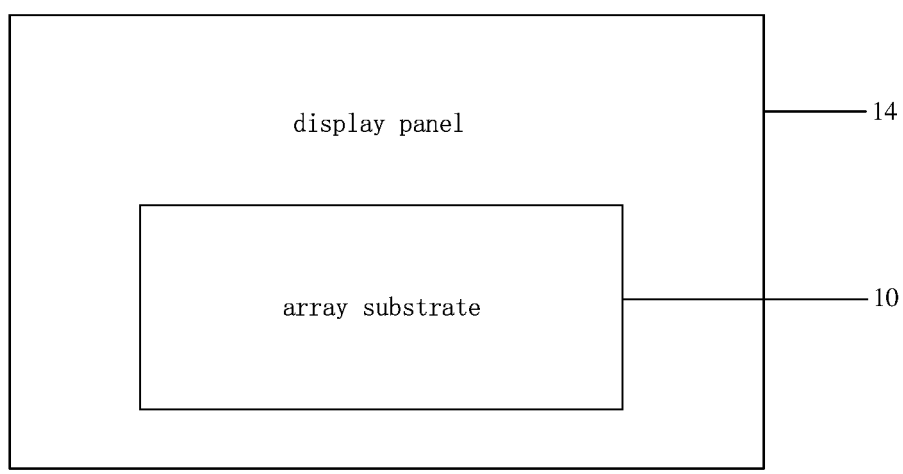
FIG. 7 is a schematic diagram of a display panel provided by at least one embodiment of the present disclosure.

For example, FIG. 7 is a schematic diagram of the display panel provided by at least one embodiment of the present disclosure. As shown in FIG. 7, the display panel 14 includes the array substrates 10 provided by any one of the embodiments of the present disclosure. In the display panel 14 provided by at least one embodiment of the present disclosure, the auxiliary conductive structure 3 receives and conducts the interfering charges around the pixel electrodes, so as to allow the interfering charges to be kept away from the pixel electrodes, thereby preventing or reducing the interference of the interfering charges on the pixel electrodes, so that the display panel 14 achieves a more accurate and stable display. For example, the display panel 14 is a liquid crystal display panel.

Figure 8A:
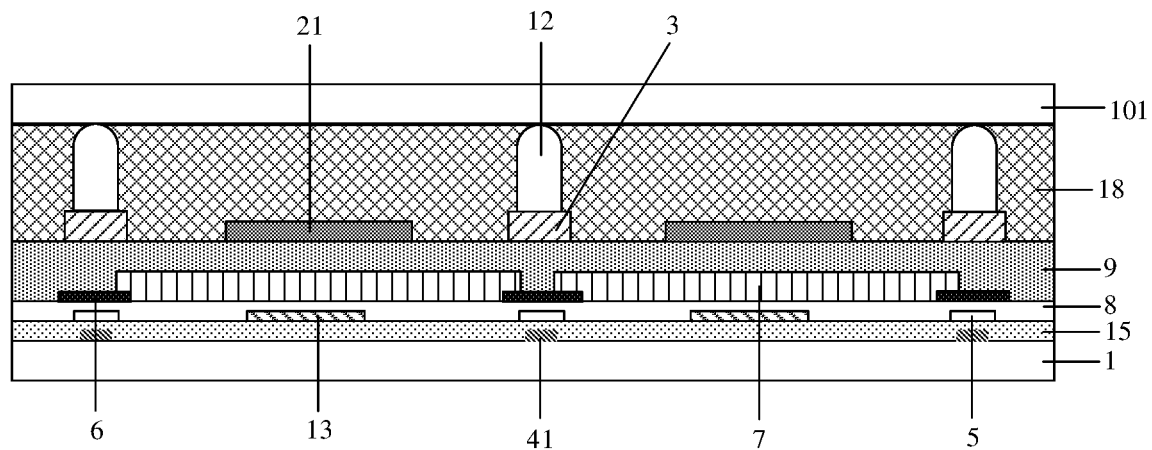
FIG. 8A is a schematic cross-sectional view of the display panel provided by at least one embodiment of the present disclosure.

FIG. 8A is a schematic cross-sectional view of the display panel provided by at least one embodiment of the present disclosure. For example, as shown in FIG. 8A, the display panel 14 is the liquid crystal display panel. In this case, the display panel 14 further includes an opposite substrate 101, a liquid crystal layer 18 and the common electrode 13. The opposite substrate 101 is opposite to the array substrate 10; the liquid crystal layer 18 is disposed between the array substrate 10 and the opposite substrate 101; and the common electrode 13 belongs to the array substrate 10. The common electrode 13 and the plurality of pixel electrodes 21 form an electric field that controls deflection of liquid crystal molecules in the liquid crystal layer 18. For example, a common voltage signal is applied to both the common electrode 13 and the auxiliary conductive structure 3 by the drive circuit, in which case the electric signal applied to the auxiliary conductive structure 3 is the same as the electric signal applied to the common electrode 13.

For example, in the display panel shown in FIG. 8A, the color filter film 7 and the shield component 6 (the shield component is, for example, the black matrix in the liquid crystal display panel) are included by the array substrate. For example, the protrusion 12 has a required height for supporting the opposite substrate 101, maintaining a liquid crystal cell gap of the display panel and spacing the liquid crystals corresponding to the respective pixel units. The protrusion 12 is disposed on the auxiliary conductive structure 3, and the auxiliary conductive structure 3 raises the protrusion 12, so that it is not necessary to separately provide the supporting layer for the protrusion 12, thereby simplifying the structure of the display panel.

Figure 8B:
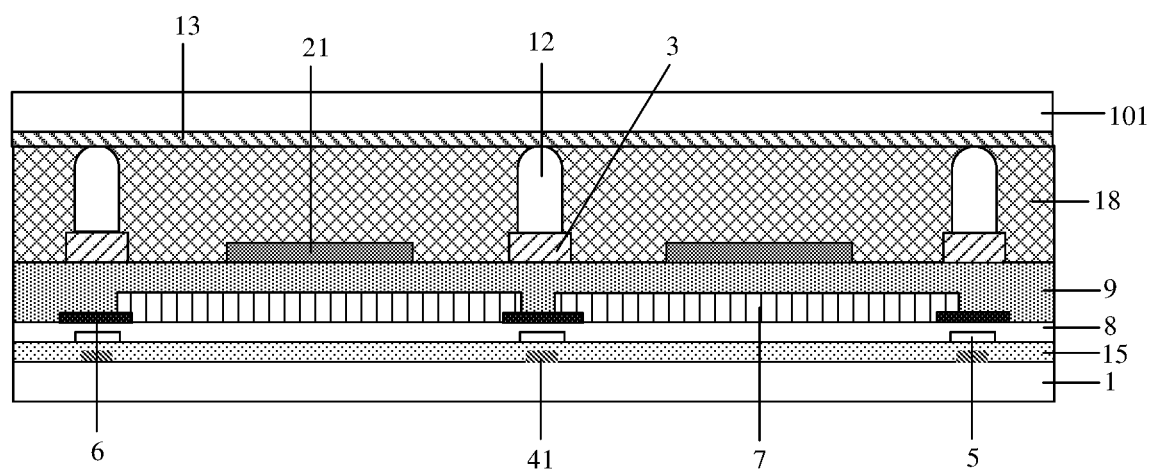
FIG. 8B is another schematic cross-sectional view of the display panel provided by at least one embodiment of the present disclosure.

FIG. 8B is another schematic cross-sectional view of the display panel provided by at least one embodiment of the present disclosure. For example, in the display panel shown in FIG. 8B, the common electrode 13 is included by the opposite substrate 101. For example, the common electrode 13 is a structure in a one-piece form to cover the plurality of pixel units.

Figure 8C:
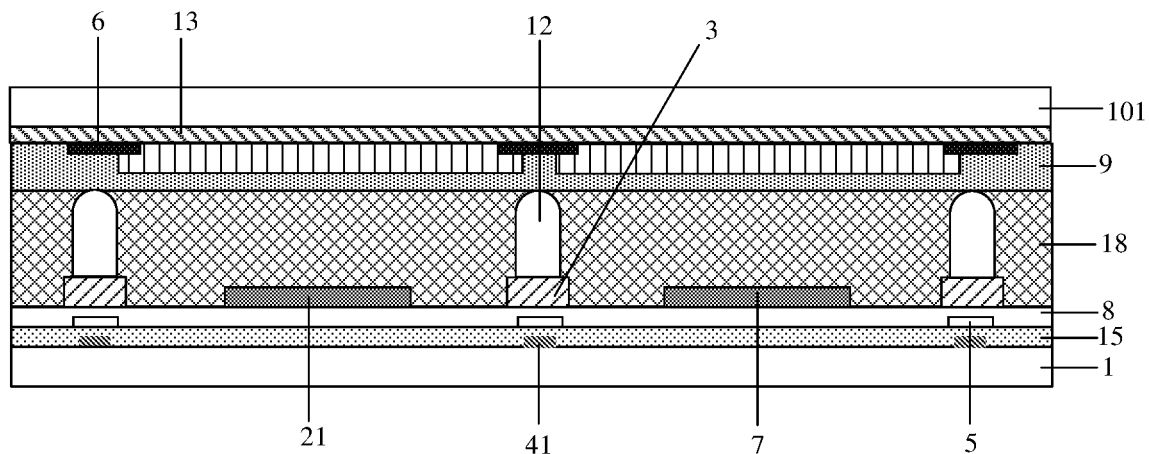
FIG. 8C is still another schematic cross-sectional view of the display panel provided by at least one embodiment of the present disclosure.

FIG. 8C is still another cross-sectional view of the display panel provided by at least one embodiment of the present disclosure. For example, in the display panel shown in FIG. 8C, the common electrode 13, the color filter film 7 and the covering 6 are included by the opposite substrate 101.

At least one embodiment of the present disclosure further provides a display device including the display panel provided by any one of the embodiments of the present disclosure.

Figure 9:
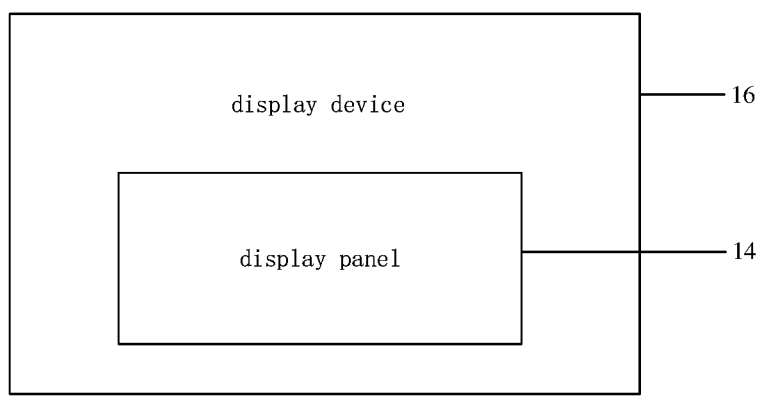
FIG. 9 is a schematic diagram of a display device provided by at least one embodiment of the present disclosure.

For example, FIG. 9 is a schematic diagram of the display device provided by at least one embodiment of the present disclosure. As shown in FIG. 9, the display device 16 includes the display panel 14 provided by any one of the embodiments of the present disclosure. In the display device 16 provided by at least one embodiment of the present disclosure, the auxiliary conductive structure 3 receives and conducts the interfering charges around the pixel electrodes, so as to allow the interfering charges to be kept away from the pixel electrodes, thereby preventing or reducing the interference of the interfering charges on the pixel electrodes, so that the display device 16 achieves a more accurate and stable display effect. For example, the display device 16 is a liquid crystal display device. For example, the display device may be any product or component having a display function, such as a mobile phone, a tablet computer, a television, a display, a notebook computer, a digital photo frame, a navigator, and the like.

It should be noted that, in the case of no conflict, the embodiments of the present disclosure and the features in the embodiments may be combined with each other to obtain a new embodiment.

What are described above is related to the illustrative embodiments of the disclosure only and not limitative to the scope of the disclosure; the scopes of the disclosure are defined by the accompanying claims.

What is claimed is:

1. An array substrate, comprising:
a base substrate, a pixel array and an auxiliary conductive structure which are on the base substrate, wherein the pixel array comprises a plurality of pixel units distributed in an array and a plurality of pixel electrodes, and each of the plurality of pixel units comprises at least one of the plurality of pixel electrodes;
the auxiliary conductive structure surrounds at least one of the plurality of pixel electrodes and is insulated from the plurality of pixel electrodes;
the array substrate further comprises: a plurality of gate lines and a plurality of data lines, provided on the base substrate and crossing each other to define the plurality of pixel units;
the auxiliary conductive structure comprises a plurality of strip portions respectively extending along an extension direction of the plurality of data lines and an extension direction of the plurality of gate lines;
the plurality of strip portions of the auxiliary conductive structure overlap at least a part of the plurality of gate lines and/or overlap at least a part of the plurality of data lines in a direction perpendicular to the base substrate;
the array substrate further comprises a common electrode in a layer different from a layer where the plurality of pixel electrodes are located;
at least one strip portion among the plurality of strip portions of the auxiliary conductive structure comprises a plurality of hollow regions which are spaced apart from each other and penetrate through the at least one strip portion; and
each of the plurality of hollow regions overlaps at least a part of at least one of the plurality of gate lines, the plurality of data lines and the common electrode in the direction perpendicular to the base substrate.

2. The array substrate according to claim 1, wherein a material of the auxiliary conductive structure has a resistivity less than or equal to a resistivity of a material of the at least one, surrounded by the auxiliary conductive structure, of the plurality of pixel electrodes.

3. The array substrate according to claim 1, wherein the auxiliary conductive structure and the plurality of pixel electrodes are in a same layer.

4. The array substrate according to claim 1, wherein a planar shape, viewed in a direction perpendicular to the base substrate, of the auxiliary conductive structure comprises a closed loop surrounding the at least one of the plurality of pixel electrodes.

5. The array substrate according to claim 4, wherein
the plurality of pixel units comprise a first pixel unit and a second pixel unit which are adjacent to each other;
each of the first pixel unit and the second pixel unit comprises a first pixel electrode and a second pixel electrode of the plurality of pixel electrodes;
the planar shape of the auxiliary conductive structure comprises the closed loop surrounding the second pixel electrode in the first pixel unit and the first pixel electrode in the second pixel unit.

6. The array substrate according to claim 1, wherein
distances between adjacent hollow regions among the plurality of hollow regions are equal; and
a width of each of the plurality of hollow regions is smaller than a width of the at least one strip portion in a direction perpendicular to an extension direction of the at least one strip portion.

7. The array substrate according to claim 1, wherein each of the plurality of pixel units further comprises a thin film transistor connected with the at least one of the plurality of pixel electrodes;

the auxiliary conductive structure covers at least a part of the thin film transistor.

8. The array substrate according to claim 7, wherein the plurality of strip portions of the auxiliary conductive structure comprise:
first strip portions extending along the extension direction of the plurality of gate lines; and
second strip portions extending along the extension direction of the plurality of data lines;
wherein a width of each first strip portion in a direction perpendicular to an extension direction of the first strip portions is greater than a width of each second strip portion in a direction perpendicular to an extension direction of the second strip portions.

9. The array substrate according to claim 8, wherein
distances from one of the first strip portions to two of the plurality of pixel electrodes adjacent to the one of the first strip portions are not equal; and
distances from one of the second strip portions to two of the plurality of pixel electrodes adjacent to the one of the second strip portions are not equal; and
distances from two adjacent ones of the first strip portions to a same one of the plurality of pixel electrodes between the two adjacent ones of the first strip portions are not equal; and
distances from two adjacent ones of the second strip portions to a same one of the plurality of pixel electrodes between the two adjacent ones of the second strip portions are not equal.

10. The array substrate according to claim 7, wherein
at least one pixel unit among the plurality of pixel units comprises an end position, an intermediate position, and a start position close to the thin film transistor, wherein the end position is away from the start position in an extension direction of at least one strip portion among the plurality of strip portions of the auxiliary conductive structure, and the intermediate position is at a midpoint of a connecting line between the start position and the end position;
the at least one strip portion comprises a first portion extending from the start position of the at least one pixel unit to the intermediate position of the at least one pixel unit and a second portion extending from the intermediate position of the at least one pixel unit to the end position of the at least one pixel unit, the first portion has a first width in a direction perpendicular to the extension direction of the at least one strip portion, the second portion has a second width in the direction perpendicular to the extension direction of the at least one strip portion, and the first width is greater than the second width; or, the at least one strip portion comprises a first portion, a second portion and a third portion which extend and are sequentially arranged in a direction from the start position of the at least one pixel unit to the end position of the at least one pixel unit, and a width of the first portion in the direction perpendicular to the extension direction of the at least one strip portion, a width of the second portion in the direction perpendicular to the extension direction of the at least one strip portion and a width of the third portion in the direction perpendicular to the extension direction of the at least one strip portion are sequentially decreased; or, the at least one strip portion comprises a plurality of portions which extend and are sequentially arranged in the direction from the start position of the at least one pixel unit to the end position of the at least one pixel unit, a total number of the plurality of portions is more than three, and widths, in the direction perpendicular to the extension direction of the at least one strip portion, of the plurality of portions are sequentially decreased.

11. The array substrate according to claim 1, further comprising:
a shield component between adjacent ones of the plurality of pixel units; and
a color filter film array comprising a plurality of color filter films, wherein each of the plurality of pixel units comprises one of the plurality of color filter films;
wherein the plurality of strip portions of the auxiliary conductive structure overlap the shield component in a direction perpendicular to the base substrate;
the shield component is a black matrix or is a stack of two adjacent color filter films among the plurality of color filter films.

12. The array substrate according to claim 1, wherein
a planar shape, viewed in a direction perpendicular to the base substrate, of at least one pixel electrode among the plurality of pixel electrodes comprises a groove, the auxiliary conductive structure comprises a protrusion portion, and the protrusion portion is at a side of at least one of the plurality of strip portions facing the at least one pixel electrode and is corresponding to the groove; or
the planar shape of at least one pixel electrode among the plurality of pixel electrodes comprises a protrusion portion, the auxiliary conductive structure comprises a groove, and the groove is at a side of at least one of the plurality of strip portions facing the at least one pixel electrode and is corresponding to the protrusion portion.

13. The array substrate according to claim 12, wherein the protrusion portion and the at least one of the plurality of strip portions are integral with each other.

14. The array substrate according to claim 1, further comprising a protrusion protruding in a direction away from the base substrate, wherein the protrusion is on the auxiliary conductive structure.

15. The array substrate according to claim 1, further comprising a leading wire on the base substrate and further comprising data driver elements or gate driver elements which are on the base substrate, wherein the auxiliary conductive structure is grounded or is applied with a fixed voltage through the leading wire, and the leading wire is between adjacent ones of the data driver elements or adjacent ones of the gate driver elements.

16. A display device, comprising:
the array substrate according to claim 1;
an opposite substrate, opposing to the array substrate;
a liquid crystal layer, provided between the array substrate and the opposite substrate; and
a common electrode, provided on the array substrate and/or the opposite substrate, in which the common electrode and the plurality of pixel electrodes form an electric field to control deflection of liquid crystal molecules in the liquid crystal layer, wherein
an electrical signal applied to the auxiliary conductive structure is same as an electrical signal applied to the common electrode.

17. An array substrate, comprising:
a base substrate, a pixel array and an auxiliary conductive structure which are on the base substrate, wherein
the pixel array comprises a plurality of pixel units distributed in an array and a plurality of pixel electrodes, and each of the plurality of pixel units comprises at least one of the plurality of pixel electrodes;

the auxiliary conductive structure surrounds at least one of the plurality of pixel electrodes and is insulated from the plurality of pixel electrodes;

the array substrate further comprises: a plurality of gate lines and a plurality of data lines, provided on the base substrate and crossing each other to define the plurality of pixel units;

the auxiliary conductive structure comprises a plurality of strip portions respectively extending along an extension direction of the plurality of data lines and an extension direction of the plurality of gate lines;

the plurality of strip portions of the auxiliary conductive structure overlap at least a part of the plurality of gate lines and/or overlap at least a part of the plurality of data lines in a direction perpendicular to the base substrate;

each of the plurality of pixel units further comprises a thin film transistor connected with the at least one of the plurality of pixel electrodes;

the auxiliary conductive structure covers at least a part of the thin film transistor;

at least one pixel unit among the plurality of pixel units comprises an end position, an intermediate position, and a start position close to the thin film transistor, wherein the end position is away from the start position in an extension direction of at least one strip portion among the plurality of strip portions of the auxiliary conductive structure, and the intermediate position is at a midpoint of a connecting line between the start position and the end position;

the at least one strip portion comprises a first portion extending from the start position of the at least one pixel unit to the intermediate position of the at least one pixel unit and a second portion extending from the intermediate position of the at least one pixel unit to the end position of the at least one pixel unit, the first portion has a first width in a direction perpendicular to the extension direction of the at least one strip portion, the second portion has a second width in the direction perpendicular to the extension direction of the at least one strip portion, and the first width is greater than the second width; or, the at least one strip portion comprises a first portion, a second portion and a third portion which extend and are sequentially arranged in a direction from the start position of the at least one pixel unit to the end position of the at least one pixel unit, and a width of the first portion in the direction perpendicular to the extension direction of the at least one strip portion, a width of the second portion in the direction perpendicular to the extension direction of the at least one strip portion and a width of the third portion in the direction perpendicular to the extension direction of the at least one strip portion are sequentially decreased; or, the at least one strip portion comprises a plurality of portions which extend and are sequentially arranged in the direction from the start position of the at least one pixel unit to the end position of the at least one pixel unit, a total number of the plurality of portions is more than three, and widths, in the direction perpendicular to the extension direction of the at least one strip portion, of the plurality of portions are sequentially decreased.

18. The array substrate according to claim 17, wherein a material of the auxiliary conductive structure has a resistivity less than or equal to a resistivity of a material of the at least one, surrounded by the auxiliary conductive structure, of the plurality of pixel electrodes.

19. An array substrate, comprising:
a base substrate, a pixel array and an auxiliary conductive structure which are on the base substrate, wherein
the pixel array comprises a plurality of pixel units distributed in an array and a plurality of pixel electrodes, and each of the plurality of pixel units comprises at least one of the plurality of pixel electrodes;
the auxiliary conductive structure surrounds at least one of the plurality of pixel electrodes and is insulated from the plurality of pixel electrodes;
the array substrate further comprises: a plurality of gate lines and a plurality of data lines, provided on the base substrate and crossing each other to define the plurality of pixel units;
the auxiliary conductive structure comprises a plurality of strip portions respectively extending along an extension direction of the plurality of data lines and an extension direction of the plurality of gate lines;
a planar shape, viewed in a direction perpendicular to the base substrate, of at least one pixel electrode among the plurality of pixel electrodes comprises a groove, the auxiliary conductive structure comprises a protrusion portion, and the protrusion portion is at a side of at least one of the plurality of strip portions facing the at least one pixel electrode and is corresponding to the groove; or
the planar shape of at least one pixel electrode among the plurality of pixel electrodes comprises a protrusion portion, the auxiliary conductive structure comprises a groove, and the groove is at a side of at least one of the plurality of strip portions facing the at least one pixel electrode and is corresponding to the protrusion portion.

20. The array substrate according to claim 19, wherein a material of the auxiliary conductive structure has a resistivity less than or equal to a resistivity of a material of the at least one, surrounded by the auxiliary conductive structure, of the plurality of pixel electrodes.

\* \* \* \* \*